US010903231B2

(12) United States Patent
Lee et al.

(10) Patent No.: US 10,903,231 B2
(45) Date of Patent: Jan. 26, 2021

(54) THREE-DIMENSIONAL SEMICONDUCTOR MEMORY DEVICES AND METHODS OF FABRICATING THE SAME

(71) Applicant: Samsung Electronics Co., Ltd., Suwon-si (KR)

(72) Inventors: Sanghoon Lee, Seongnam-si (KR); Sunggil Kim, Yongin-si (KR); Seulye Kim, Seoul (KR); Hwaeon Shin, Suwon-si (KR); Joonsuk Lee, Seoul (KR); Hyeeun Hong, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/217,696

(22) Filed: Dec. 12, 2018

(65) Prior Publication Data
US 2019/0355741 A1 Nov. 21, 2019

(30) Foreign Application Priority Data
May 21, 2018 (KR) .................. 10-2018-0057878

(51) Int. Cl.
| H01L 27/11582 | (2017.01) |
| H01L 27/1157 | (2017.01) |
| H01L 21/02 | (2006.01) |
| H01L 29/66 | (2006.01) |
| H01L 21/3213 | (2006.01) |
| H01L 21/768 | (2006.01) |
| H01L 29/10 | (2006.01) |
| H01L 27/11556 | (2017.01) |
| H01L 27/11519 | (2017.01) |

(Continued)

(52) U.S. Cl.
CPC .. *H01L 27/11582* (2013.01); *H01L 21/02532* (2013.01); *H01L 21/02592* (2013.01); *H01L 21/32135* (2013.01); *H01L 21/76802* (2013.01); *H01L 21/76877* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 29/1037* (2013.01); *H01L 29/40114* (2019.08); *H01L 29/40117* (2019.08); *H01L 29/6653* (2013.01)

(58) Field of Classification Search
None
See application file for complete search history.

(56) References Cited

U.S. PATENT DOCUMENTS 9,634,024 B2 * 4/2017 Kanamori ......... H01L 27/11582
9,659,788 B2 5/2017 Surla et al.
(Continued)

*Primary Examiner* — Long Pham
(74) *Attorney, Agent, or Firm* — Sughrue Mion, PLLC

(57) ABSTRACT

Disclosed are three-dimensional semiconductor memory devices and methods of fabricating the same. The method includes sequentially forming a sacrificial pattern and a source conductive layer on a substrate, forming a mold structure including a plurality of insulating layers and a plurality of sacrificial layers on the source conductive layer; forming a plurality of vertical structures that penetrate the mold structure, forming a trench that penetrates the mold structure, forming a sacrificial spacer on a sidewall of the trench, removing the sacrificial pattern to form a horizontal recess region; removing the sacrificial spacer, and forming a source conductive pattern that fills the horizontal recess region.

12 Claims, 21 Drawing Sheets

(51) Int. Cl.
*H01L 27/11524* (2017.01)
*H01L 27/11565* (2017.01)
*H01L 21/28* (2006.01)

(56) References Cited

U.S. PATENT DOCUMENTS

| | | | |
|---|---|---|---|
| 9,786,673 B1* | 10/2017 | Cho | H01L 27/11582 |
| 9,812,461 B2 | 11/2017 | Doda et al. | |
| 2005/0214974 A1* | 9/2005 | Field | H03H 9/0085 |
| | | | 438/106 |
| 2017/0373089 A1* | 12/2017 | Kim | H01L 27/11582 |
| 2018/0006052 A1* | 1/2018 | Hwang | H01L 21/76843 |
| 2018/0076217 A1 | 3/2018 | Park et al. | |

* cited by examiner

FIG. 7
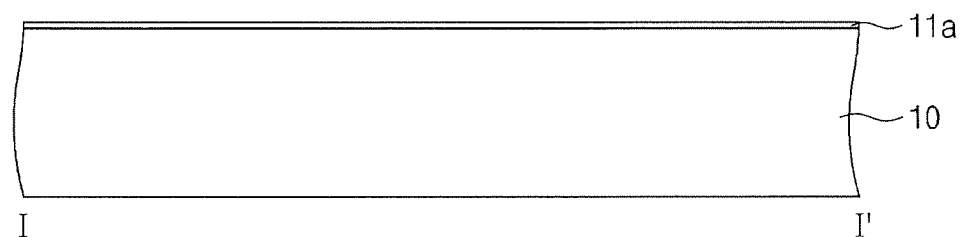
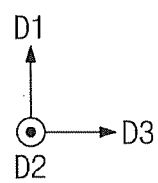
FIG. 8
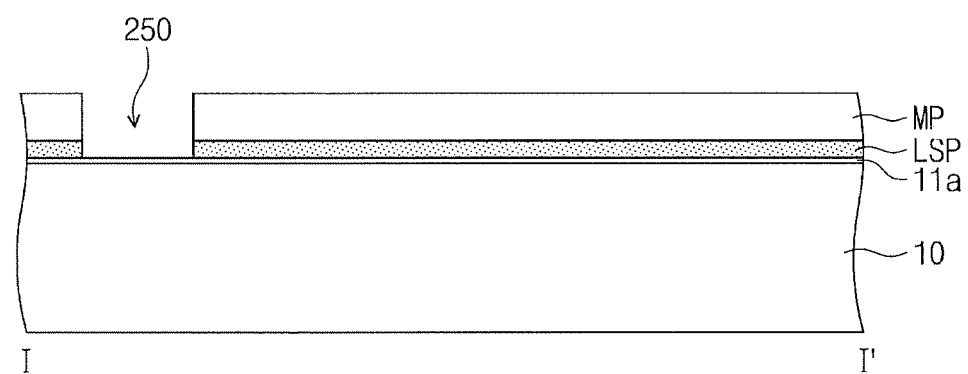
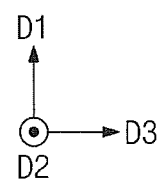

FIG. 9
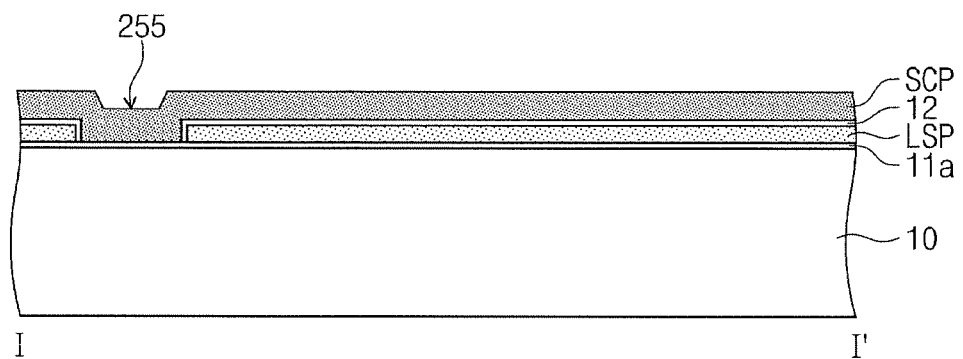
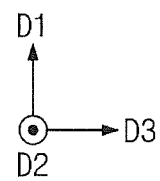
FIG. 10
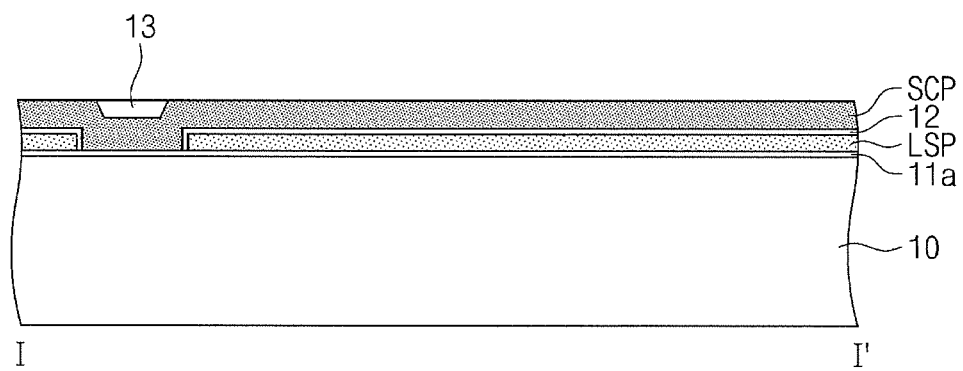
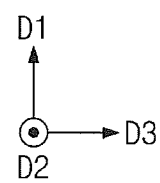

THREE-DIMENSIONAL SEMICONDUCTOR MEMORY DEVICES AND METHODS OF FABRICATING THE SAME

CROSS-REFERENCE TO RELATED APPLICATION

This U.S. nonprovisional application claims priority under 35 U.S.C § 119 to Korean Patent Application No. 10-2018-0057878 filed on May 21, 2018 in the Korean Intellectual Property Office, the entire contents of which are hereby incorporated by reference.

BACKGROUND

Inventive concepts relate to a semiconductor memory device, and more particularly, to a three-dimensional semiconductor memory device with three-dimensionally arranged memory cells and a method of fabricating the same.

Semiconductor devices have been highly integrated for satisfying high performance and low manufacture costs which are required by customers. Since integration of the semiconductor devices is an important factor in determining product price, high integration is increasingly requested in particular. Integration of typical two-dimensional or planar semiconductor memory devices is primarily determined by the area occupied by a unit memory cell, such that it is greatly influenced by the level of technology for forming fine patterns. However, the extremely expensive processing equipment needed to increase pattern fineness may set a practical limitation on increasing the integration of the two-dimensional or planar semiconductor memory devices. To overcome such limitations, it has been proposed three-dimensional semiconductor memory devices with three-dimensionally arranged memory cells.

SUMMARY

Some embodiments of inventive concepts provide a three-dimensional semiconductor memory device with enhanced electrical characteristics.

Some embodiments of inventive concepts provide a three-dimensional semiconductor memory device with improved reliability.

According to some exemplary embodiments of inventive concepts, a method of fabricating a three-dimensional semiconductor memory device may include: sequentially forming a sacrificial pattern and a source conductive layer on a substrate; forming a mold structure including a plurality of insulating layers and a plurality of sacrificial layers on the source conductive layer; forming a plurality of vertical structures that penetrate the mold structure; forming a trench that penetrates the mold structure; forming a sacrificial spacer on a sidewall of the trench; removing the sacrificial pattern to form a horizontal recess region; removing the sacrificial spacer; and forming a source conductive pattern that fills the horizontal recess region.

According to some exemplary embodiments of inventive concepts, a method of fabricating a three-dimensional semiconductor memory device may include: sequentially forming a sacrificial pattern and a source conductive layer on a substrate; forming a mold structure including a plurality of insulating layers and a plurality of sacrificial layers on the source conductive layer; forming a plurality of vertical structures including a vertical semiconductor pattern and a data storage layer that penetrate the mold structure; forming a trench that penetrates the mold structure; forming a sacrificial spacer on a sidewall of the trench; removing the sacrificial pattern to form a horizontal recess region; removing a portion of the data storage layer to expose a sidewall of the vertical semiconductor pattern, wherein the portion of the data storage layer is exposed to the horizontal recess region; selectively removing the sacrificial spacer; performing a surface treatment process after removing the sacrificial spacer; and forming a source conductive pattern that fills the horizontal recess region.

According to some exemplary embodiments of inventive concepts, a three-dimensional semiconductor memory device may include: an electrode structure including a plurality of gate electrodes sequentially stacked on a substrate; a first source conductive pattern between the substrate and the electrode structure; a vertical semiconductor pattern that penetrates the electrode structure and the first source conductive pattern; and a data storage pattern extending between the vertical semiconductor pattern and the electrode structure, wherein the vertical semiconductor pattern includes a recess region adjacent to the first source conductive pattern, and wherein the first source conductive pattern protrudes into the recess region.

BRIEF DESCRIPTION OF THE DRAWINGS

FIGS. 7 to 14, 15A to 17A, 18, and 19 illustrate cross-sectional views taken along line I-I' of FIG. 2, showing a method of fabricating a three-dimensional semiconductor memory device according to exemplary embodiments of inventive concepts.

DETAILED DESCRIPTION OF EMBODIMENTS

Some embodiments of inventive concepts will be described below in detail in conjunction with the accompanying drawings to aid in clearly understanding inventive concepts.

Figure 1:
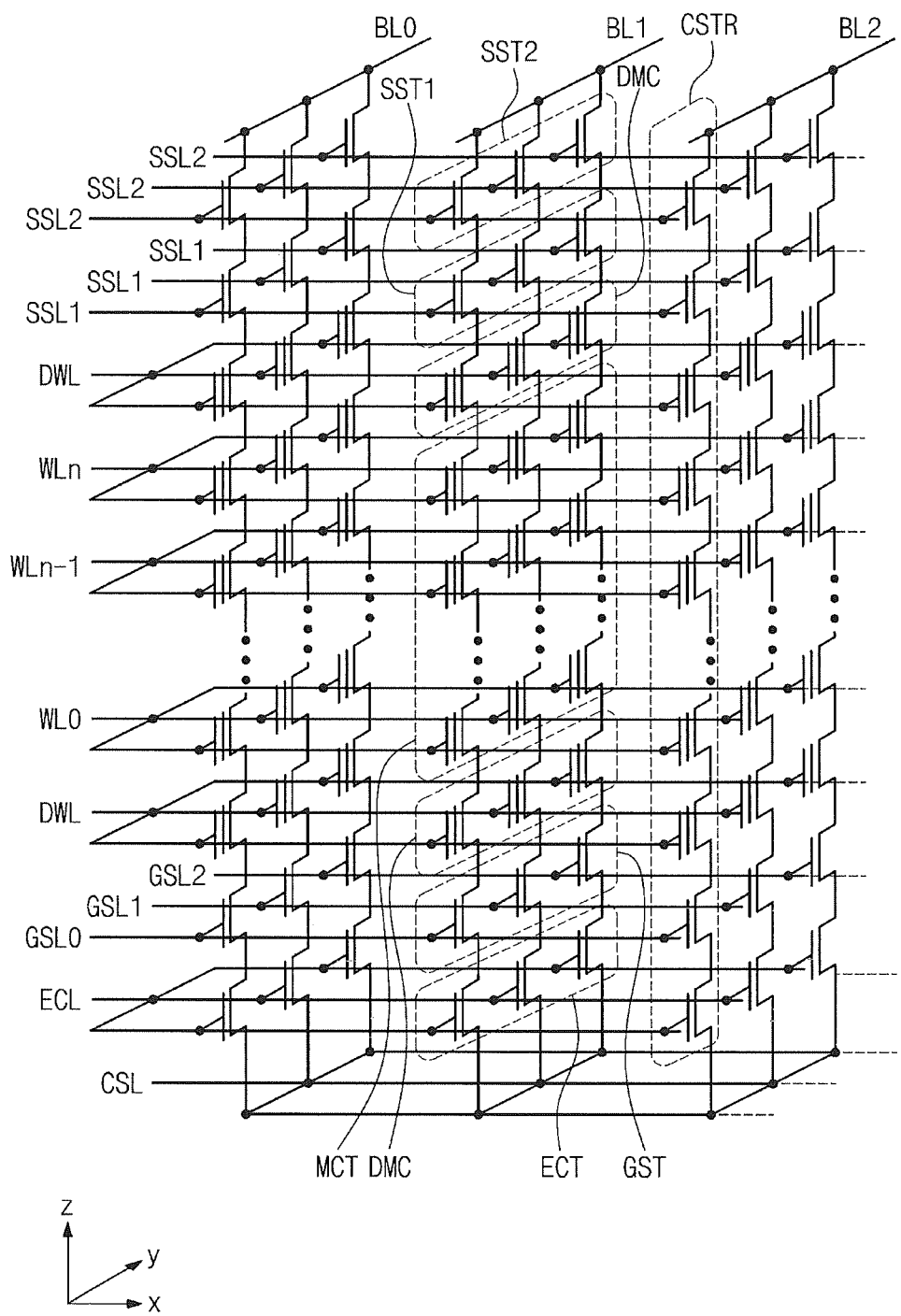
FIG. 1 illustrates a simplified circuit diagram showing a cell array of a three-dimensional semiconductor memory device according to exemplary embodiments of inventive concepts.

FIG. 1 illustrates a simplified circuit diagram showing a cell array of a three-dimensional semiconductor memory device according to exemplary embodiments of inventive concepts.

Referring to FIG. 1, a cell array of a three-dimensional semiconductor memory device may include a common source line CSL, a plurality of bit lines BL0 to BL2, and a plurality of cell strings CSTR between the common source line CSL and the bit lines BL0 to BL2. A plurality of cell strings CSTR may be connected in parallel to each of the bit lines BL0 to BL2. The cell strings CSTR may be connected in common to the common source line CSL. For example, the cell strings CSTR may be disposed between one common source line CSL and the bit lines BL0 to BL2. In some embodiments, the common source line CSL may be provided in plural, and the plurality of common source lines CSL may be two-dimensionally arranged. In this configuration, the common source lines CSL may be supplied with the same voltage or electrically controlled independently of each other.

Each of the cell strings CSTR may include string select transistors SST1 and SST2 connected in series, memory cell transistors MCT connected in series, a ground select transistor GST, and an erase control transistor ECT. Each of the memory cell transistors MCT may include a data storage element. For example, each of the cell strings CSTR may include first and second string select transistors SST1 and SST2 connected in series, and the second string select transistor SST2 may be coupled to a corresponding one of the bit lines BL0 to BL2. Alternatively, each of the cell strings CSTR may include one string select transistor. For example, similar to the first and second string select transistors SST1 and SST2, the ground select transistor GST of each of the cell strings CSTR may include a plurality of MOS transistors connected in series.

The memory cell transistors MCT of each of the cell strings CSTR may be located at different distances from the common source lines CSL. The memory cell transistors MCT may be connected in series between the first string select transistor SST1 and the ground select transistor GST. The erase control transistor ECT of each of the cell strings CSTR may be connected between the ground select transistor GST and the common source line CSL. In some embodiments, each of the cell strings CSTR may further include dummy cells DMC connected between the first string select transistor SST1 and the memory cell transistor MCT and/or between the ground select transistor GST and the memory cell transistor MCT.

The first string select transistor SST1 may be controlled by a first string select line SSL1, and the second string select transistor SST2 may be controlled by a second string select line SSL2. The memory cell transistors MCT may be controlled by a plurality of word lines WL0 to WLn, and the dummy cells DMC may be controlled by a dummy word line DWL. The ground select transistor GST may be controlled by one of ground select lines GSL0 to GSL2, and the erase control transistor ECT may be controlled by an erase control line ECL. The common source line CSL may be connected in common to sources of the erase control transistors ECT.

The memory cell transistors MCT may include gate electrodes at substantially the same distance from the common source line CSL, and the gate electrodes may be connected in common to one of the word lines WL0 to WLn and DWL, with the result that the gate electrodes may be in an equipotential state. In contrast, although the gate electrodes of the memory cell transistors MCT are located at substantially the same distance from the common source line CSL, the gate electrodes at different rows or columns may be controlled independently of each other.

The ground select lines GSL0 to GSL2 and the string select lines SSL1 and SSL2 may extend along an x-direction, while being spaced apart from each other in a y-direction. The ground select lines GSL0 to GSL2 may be located at substantially the same level from the common source line CSL and electrically separated from each other, and the string select lines SSL1 or SSL2 may be located at substantially the same level from the common source line CSL and electrically separated from each other. A common erase control line ECL may control the erase control transistors ECT included in different cell strings CSTR. The erase control transistors ECT may generate a gate induced drain leakage (GILD) when the memory cell array operates in an erase mode.

Figure 2:
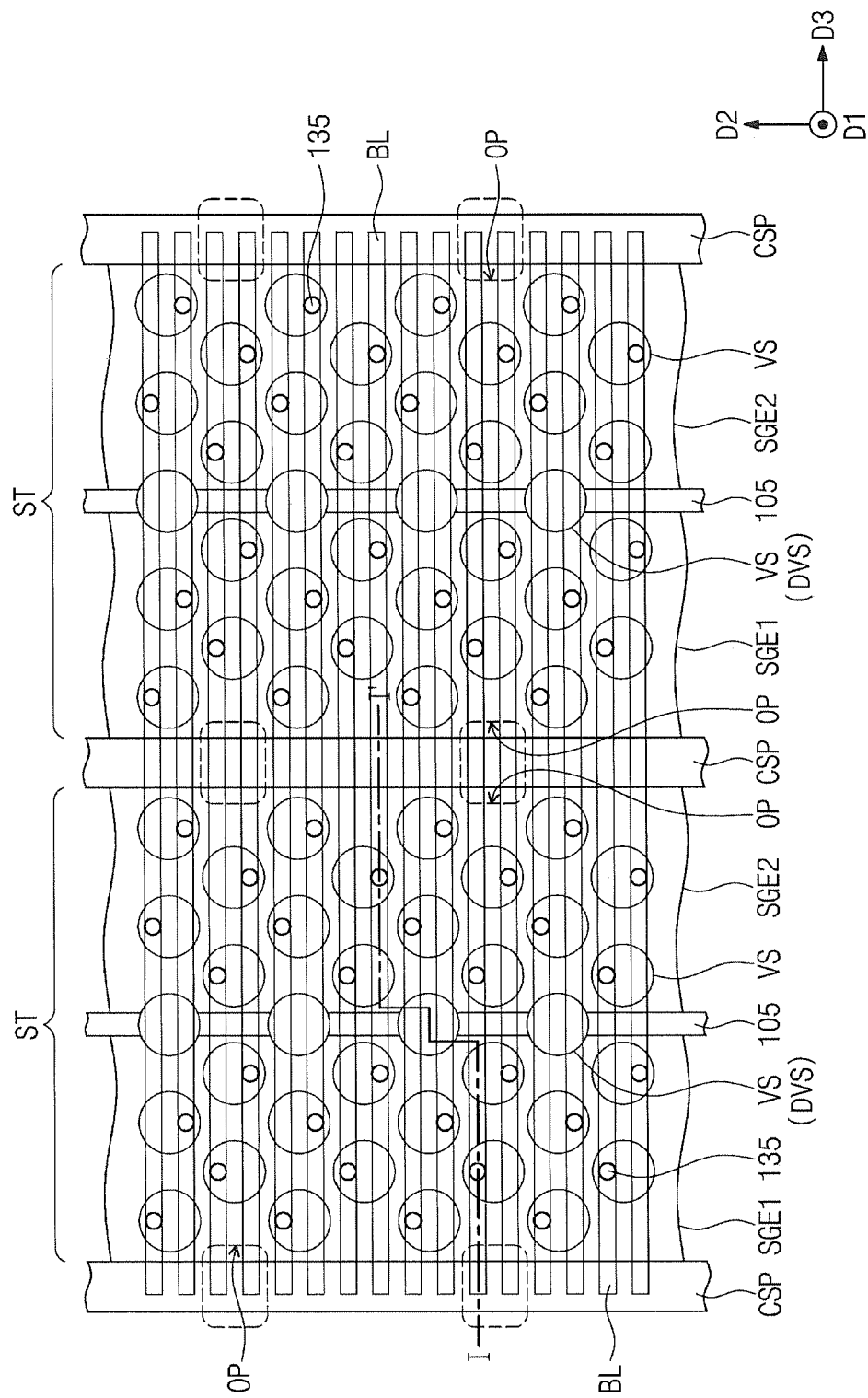
FIG. 2 illustrates a plan view showing a three-dimensional semiconductor memory device according to exemplary embodiments of inventive concepts.
Figure 3:
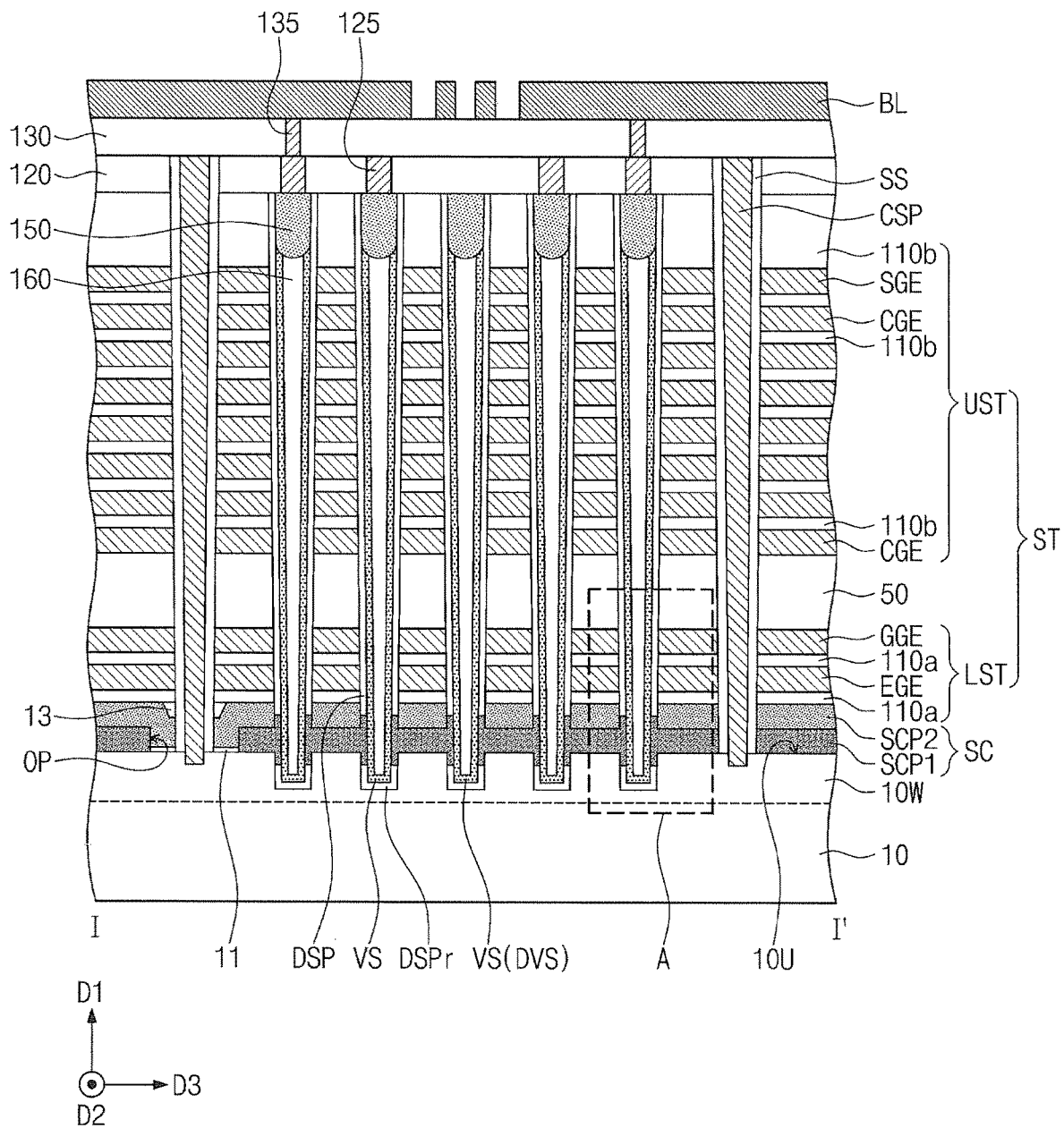
FIG. 3 illustrates a cross-sectional view taken along line I-I' of FIG. 2.
Figure 4:
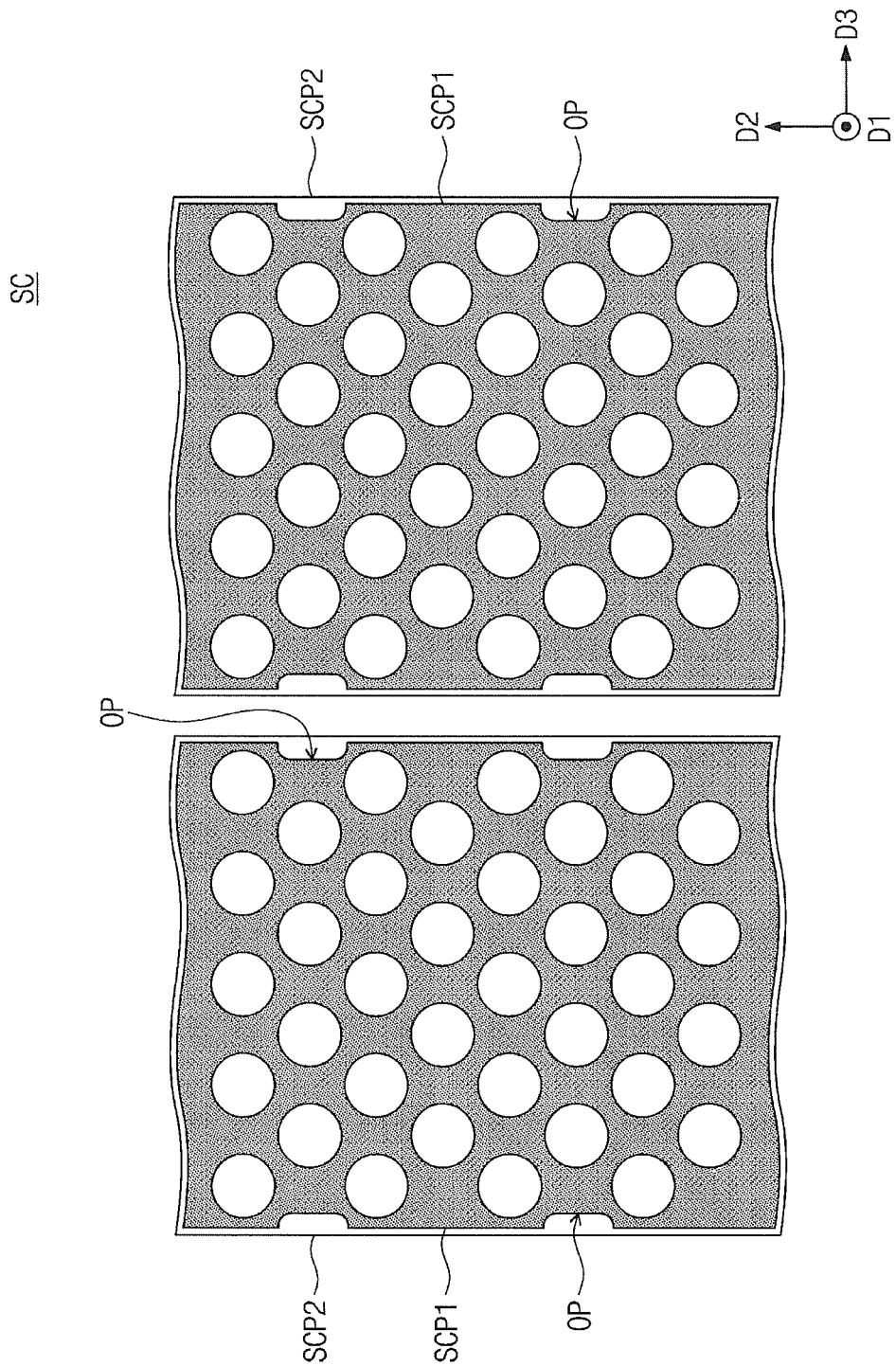
FIG. 4 illustrates a plan view showing a source structure SC of FIG. 3.
Figure 5:
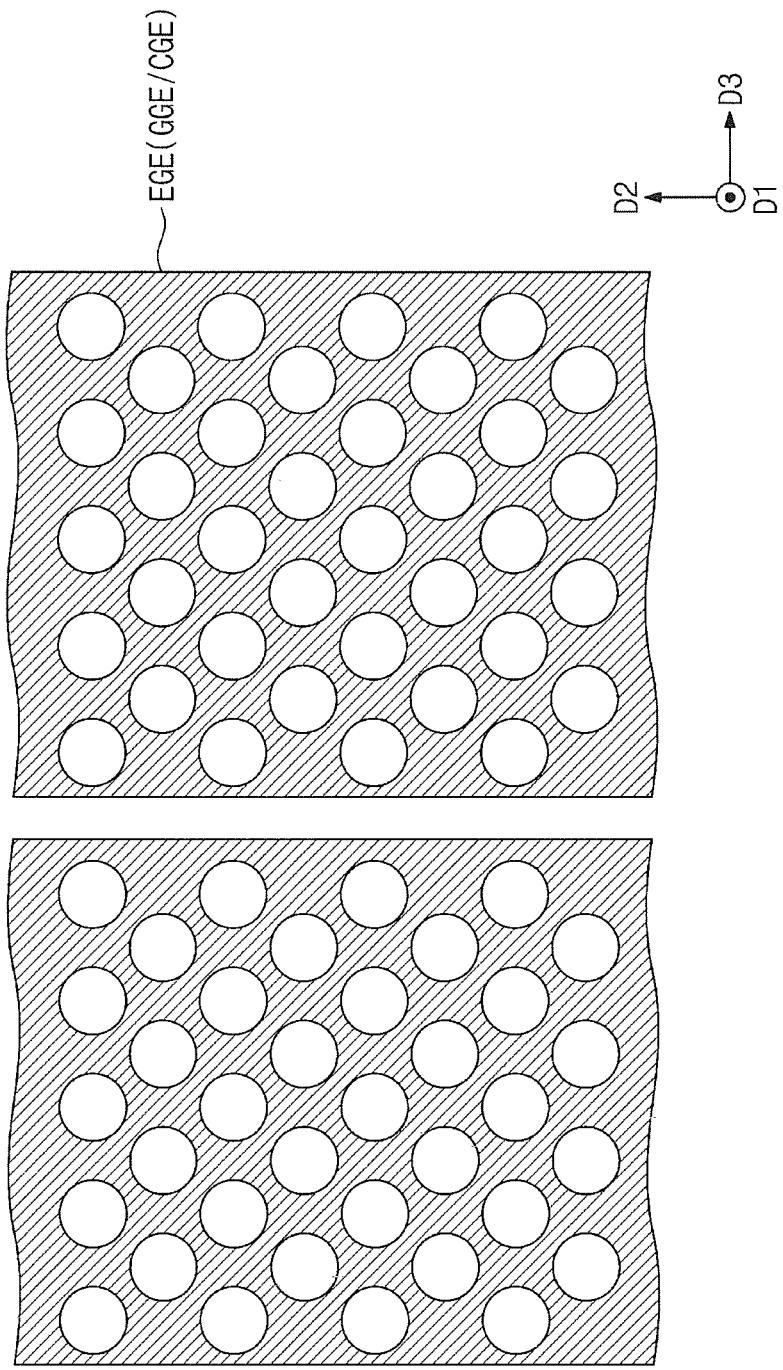
FIG. 5 illustrates a plan view showing an erase control gate electrode EGE, a ground selection gate electrode GGE, and cell gate electrodes CGE of FIG. 3.
Figure 6A:
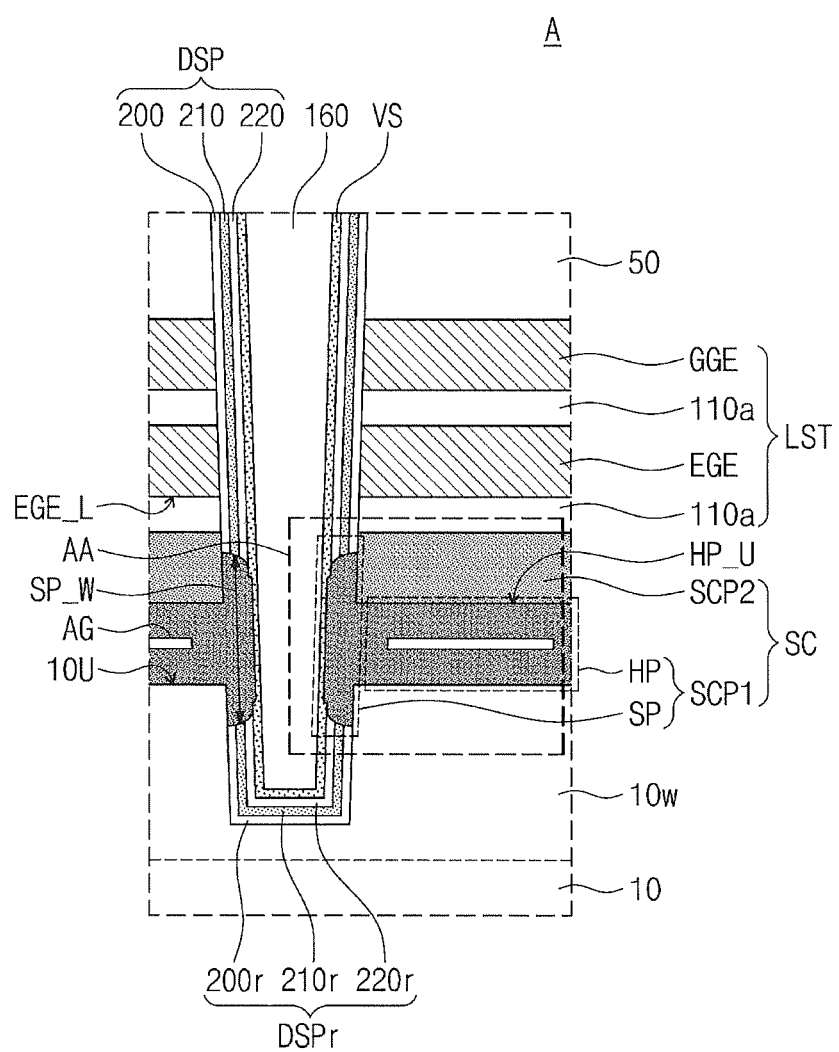
FIG. 6A illustrates an enlarged view showing section A of FIG. 3.
Figure 6B:
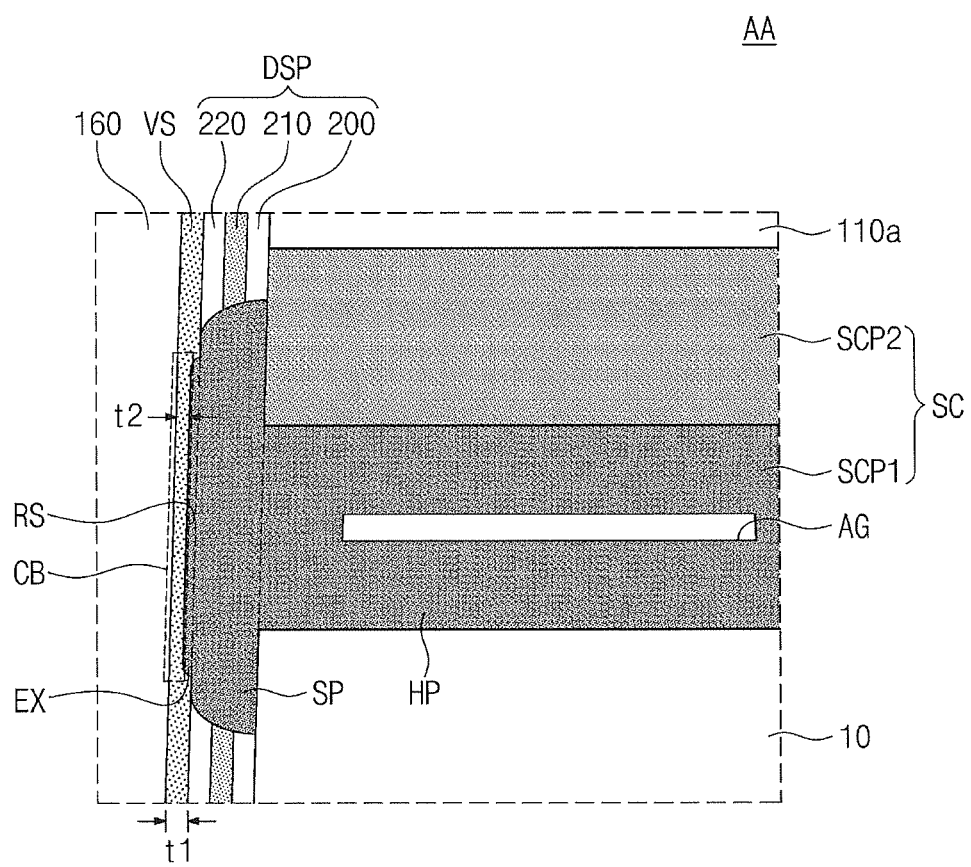
FIG. 6B illustrates an enlarged view showing section AA of FIG. 6A.

FIG. 2 illustrates a plan view showing a three-dimensional semiconductor memory device according to exemplary embodiments of inventive concepts. FIG. 3 illustrates a cross-sectional view taken along line I-I' of FIG. 2. FIG. 4 illustrates a plan view showing a source structure SC of FIG. 3. FIG. 5 illustrates a plan view showing an erase control gate electrode EGE, a ground selection gate electrode GGE, and cell gate electrodes CGE of FIG. 3. FIG. 6A illustrates an enlarged view showing section A shown in FIG. 3. FIG. 6B illustrates an enlarged view showing section AA of FIG. 6A.

Referring to FIGS. 2 and 3, a substrate 10 may be provided thereon with a source structure SC and an electrode structure ST. The substrate 10 may be or include a semiconductor substrate, such as a silicon substrate, a germanium substrate, or a silicon-germanium substrate. A well region 10w may be provided in the substrate 10. The substrate 10 may have a first conductivity, and the well region 10w may include impurities having a second conductivity different from the first conductivity. For example, the first conductivity may be P-type, and the second conductivity may be N-type. In this case, the well region 10w may include N-type impurities, such as phosphorous (P) or arsenic (As). In some embodiments, no well region 10w may be provided.

The substrate 10 and the electrode structure ST may be provided therebetween with the source structure SC provided on the well region 10w. The source structure SC and the electrode structure ST may be sequentially stacked along a first direction D1 perpendicular to a top surface 10U of the substrate 10. The electrode structure ST may extend in a second direction D2 parallel to the top surface 10U of the substrate 10, and the source structure SC may extend in the second direction D2 below the electrode structure ST. The source structure SC may include a first source conductive pattern SCP1 and a second source conductive pattern SCP2 sequentially stacked on the substrate 10. The first source conductive pattern SCP1 may directly contact the well region 10w. In some embodiments, an insulating layer 11 may be optionally provided between the first source conductive pattern SCP1 and the well region 10w. Each of the first and second source conductive patterns SCP1 and SCP2 may include a semiconductor material doped with impurities having the second conductivity. The first source conductive pattern SCP1 may have an impurity concentration greater than that of the second source conductive pattern SCP2. For example, each of the first and second source conductive patterns SCP1 and SCP2 may include polysilicon doped with N-type impurities (e.g., phosphorous (P) or arsenic (As)), and an N-type impurity concentration may be greater in the first source conductive pattern SCP1 than in the second source conductive pattern SCP2.

Referring to FIGS. 3 and 4, the first source conductive pattern SCP1 may have recessed lateral surfaces OP. Each of the recessed lateral surfaces OP may be concave toward an inside of the first source conductive pattern SCP1. The first source conductive pattern SCP1 may have at least a pair of the recessed lateral surfaces OP that are parallel to the top surface 10U of the substrate 10 and extend along a third direction D3 intersecting the second direction D2. The second source conductive pattern SCP2 may cover a top surface of the first source conductive pattern SCP1 and extend onto the recessed lateral surfaces OP of the first source conductive pattern SCP1. A portion of the second source conductive pattern SCP2 may cover the recessed lateral surfaces OP of the first source conductive pattern SCP1, and may contact the substrate 10 or the insulating layer 11 on the well region 10w. In some embodiments, the insulating layer 11 may not be provided, and in this case, the portion of the second source conductive pattern SCP2 may directly contact the substrate 10 or the well region 10w. A separation layer 13 may be provided on the second source conductive pattern SCP2. The separation layer 13 may be disposed on the recessed lateral surfaces OP.

Referring back to FIGS. 2 and 3, the electrode structure ST may include a lower electrode structure LST, an upper electrode structure UST, and a planarized insulating layer 50 between the lower electrode structure LST and the upper electrode structure UST. The lower electrode structure LST may include lower gate electrodes EGE and GGE and lower insulating layers 110a that are alternately stacked along the first direction D1 on the source structure SC. The upper electrode structure UST may include upper gate electrodes CGE and SGE and upper insulating layers 110b that are alternately stacked along the first direction D1 on the planarized insulating layer 50. The planarized insulating layer 50 may be interposed between an uppermost gate electrode GGE of the lower gate electrodes EGE and GGE and a lowermost gate electrode CGE of the upper gate electrodes CGE and SGE. The lower insulating layers 110a, the upper insulating layers 110b, and the planarized insulating layer 50 may each have a thickness in the first direction D1. The thickness of the planarized insulating layer 50 may be greater than the thicknesses of the lower and upper insulating layers 110a and 110b. The lower and upper insulating layers 110a and 110b may have substantially the same thickness, or one or more of the lower and upper insulating layers 110a and 110b may be thicker than others of the lower and upper insulating layers 110a and 110b. For example, an uppermost insulating layer 110b of the lower and upper insulating layers 110a and 110b may be thicker than the rest of the lower and upper insulating layers 110a and 110b.

The lower gate electrodes EGE and GGE and the upper gate electrodes CGE and SGE may include doped semiconductor (e.g., doped silicon), metal (e.g., tungsten, copper, or aluminum), conductive metal nitride (e.g., titanium nitride or tantalum nitride), transition metal (e.g., titanium or tantalum), or any combination thereof. The lower insulating layers 110a, the upper insulating layers 110b, and the planarized insulating layer 50 may include a silicon oxide layer and/or a low-k dielectric layer.

Referring to FIGS. 2, 3, and 5, the lower gate electrodes EGE and CGE may include an erase control gate electrode EGE and a ground selection gate electrode GGE on the erase control gate electrode EGE. The erase control gate electrode EGE may be adjacent to the source structure SC. A lowermost one of the lower insulating layers 110a may be interposed between the erase control gate electrode EGE and the source structure SC. The erase control gate electrode EGE may be used as a gate electrode of the erase control transistor ECT that controls an erase operation of the memory cell array shown in FIG. 1. The ground selection gate electrode GGE may be used as a gate electrode of the ground select transistor GST shown in FIG. 1. Each of the erase control gate electrode EGE and the ground selection gate electrode CGE may have a linear shape extending in the second direction D2.

The upper gate electrodes CGE and SGE may include cell gate electrodes CGE and a string selection gate electrode SGE. The cell gate electrodes CGE may be provided between the ground selection gate electrode GGE and the string selection gate electrode SGE, and may be located at different heights from the top surface 10U of the substrate 10. The cell gate electrodes CGE may be used as gate electrodes of the memory cell transistors MCT shown in FIG. 1. Each of the cell gate electrodes CGE may have a linear shape extending in the second direction D2. The string selection gate electrode SGE may include a pair of string selection gate electrodes SGE1 and SGE2 that are horizontally spaced apart from each other. The pair of string selection gate electrodes SGE1 and SGE2 may be spaced apart from each other in the third direction D3. The pair of string selection gate electrodes SGE1 and SGE2 may be separated from each other by a separation insulating pattern 105 interposed therebetween. The separation insulating pattern 105 may have a linear shape extending in the second direction D2. The separation insulating pattern 105 may include an insulating material, such as a silicon oxide layer. The string selection gate electrode SGE may be used as a gate electrode of the string select transistor SST2 shown in FIG. 1. In some embodiments, an additional string selection gate electrode SGE may be provided between the string selection gate electrode SGE and an uppermost one of the cell gate electrodes CGE. In this case, the additional string selection gate electrode SGE may include an additional pair of string selection gate electrodes SGE1 and SGE2 that are spaced apart from each other in the third direction D3, and the string selection gate electrodes SGE may be used as gate electrodes of the string select transistors SST1 and SST2 shown in FIG. 1.

Referring back to FIGS. 2 and 3, vertical semiconductor patterns VS may be provided on the substrate 10. Each of the vertical semiconductor patterns VS may extend in the first direction D1 and penetrate the electrode structure ST and the source structure SC. Each of the vertical semiconductor patterns VS may have an end provided in the substrate 10 and/or the well region 10w. When viewed in plan, the vertical semiconductor patterns VS may be arranged in a straight or zigzag fashion. For example, when viewed in plan, the vertical semiconductor patterns VP may be arranged in a zigzag fashion along the second direction D2. Each of the vertical semiconductor patterns VS may have a macaroni or pipe shape whose bottom end is closed. The vertical semiconductor patterns VS may include a semiconductor material, such as silicon (Si), germanium (Ge), or a compound thereof. The vertical semiconductor patterns VS may be or include impurity-doped semiconductor or impurity-undoped intrinsic semiconductor. The vertical semiconductor patterns VS may include a polycrystalline semiconductor material. The vertical semiconductor patterns VS may be used as channels of the erase control transistor ECT, the string and ground select transistors SST and GST, and the memory cell transistors MCT discussed with reference to FIG. 1.

Each of the vertical semiconductor patterns VS may have a sidewall whose lower portion contacts the first source conductive pattern SCP1. For example, referring to FIG. 6A, the first source conductive pattern SCP1 may include a horizontal part HP extending substantially parallel to the top surface 10U of the substrate 10 and a vertical part SP protruding in the first direction D1 from the horizontal part HP, which horizontal and vertical parts HP and SP are disposed below the electrode structure ST. The vertical part SP may contact and surround a portion of the sidewall of the vertical semiconductor pattern VS. The horizontal part HP of the first source conductive pattern SCP1 may be interposed between the second source conductive pattern SCP2 and the top surface 10U of the substrate 10. The horizontal part HP of the first source conductive pattern SCP1 may contact the substrate 10 or the well region 10w. The vertical part SP of the first source conductive pattern SCP1 may extend between the substrate 10 and the sidewall of the vertical semiconductor pattern VS and between the second source conductive pattern SCP2 and the sidewall of the vertical semiconductor pattern VS. The horizontal part HP of the first source conductive pattern SCP1 may include air gaps AG or seams formed therein.

The vertical part SP may horizontally protrude into the vertical semiconductor pattern VS adjacent thereto. For example, referring to FIG. 6B, the vertical semiconductor pattern VS may include a recession RS adjacent to the vertical part SP, and the vertical part SP may include a protrusion EX extending into the recession RS. Each of the recession RS and the protrusion EX may have a ring shape extending along an outer circumferential surface of the vertical semiconductor pattern VS.

The vertical semiconductor pattern VS may be relatively thin at its area adjacent to the protrusion EX. For example, the vertical semiconductor pattern VS may have a thickness t1 at its area spaced apart from the protrusion EX and a thickness t2, which is less than the thickness t1, at its area adjacent to the protrusion EX.

The vertical semiconductor pattern VS may include an impurity region CB at its area adjacent to the protrusion EX, which impurity region CB includes etchant atoms. For example, the impurity region CB may contain bromine (Br) atoms and/or chlorine (Cl) atoms at a concentration of about $1 \times 10^{16}$ atoms/cm$^3$ to about $1 \times 10^{19}$ atoms/cm$^3$. In contrast, the vertical semiconductor pattern VS may include substantially neither bromine (Br) atoms nor chlorine (Cl) atoms at its other region, for example, adjacent to the lower electrode structure LST.

Referring back to FIGS. 2 and 3, a data storage pattern DSP may be interposed between the electrode structure ST and each of the vertical semiconductor patterns VS. The data storage pattern DSP may extend in the first direction D1 and surround the sidewall of each of the vertical semiconductor patterns VS. The data storage pattern DSP may have a macaroni or pipe shape whose top and bottom ends are opened. The data storage pattern DSP may have a bottom surface in contact with the first source conductive pattern SCP1.

For example, referring to FIGS. 6A and 6B, the bottom surface of the data storage pattern DSP may be located at a height less than that of a bottom surface EGE_L of the erase control gate electrode EGE, and may contact the vertical part SP of the first source conductive pattern SCP1. In this description, the term "height" may mean a distance from the top surface 10U of the substrate 10. In some embodiments, the bottom surface of the data storage pattern DSP may be interposed between the second source conductive pattern SCP2 and the sidewall of each of the vertical semiconductor patterns VS. The bottom surface of the data storage pattern DSP may be located at a height greater than that of a top surface HP_U of the horizontal part HP of the first source conductive pattern SCP1.

The data storage pattern DSP may be a data storage layer of a NAND Flash memory device. The data storage pattern DSP may include a first insulating pattern 210 between the electrode structure ST and the vertical semiconductor pattern VS, a second insulating pattern 200 between the first insulating pattern 210 and the electrode structure ST, and a third insulating pattern 220 between the first insulating pattern 210 and the vertical semiconductor pattern VS. The first insulating pattern 210 may be a charge storage layer including, for example, a trap insulating layer, a floating gate electrode, or an insulating layer containing conductive nanodots. For example, the first insulating pattern 210 may include one or more of a silicon nitride layer, a silicon oxynitride layer, a silicon-rich nitride layer, a nano-crystalline silicon layer, and a laminated trap layer. The second insulating pattern 200 may include a material whose band gap is greater than that of the first insulating pattern 210. The second insulating pattern 200 may be a blocking insulating layer including, for example, a high-k dielectric layer such as an aluminum oxide layer and a hafnium oxide layer. The third insulating pattern 220 may include a material whose band gap is greater than that of the first insulating pattern 210. The third insulating pattern 220 may be a tunnel insulating layer including, for example, a silicon oxide layer.

The data storage pattern DSP may be configured such that a portion of the bottom surface is located at a different height relative to the top surface 10U of the substrate 10 from that of another portion of the bottom surface. The vertical part SP of the first source conductive pattern SCP1 may have a width SP_W in a vertically extending direction (e.g., the first direction D1) of the sidewall of the vertical semiconductor pattern VS. The width SP_W of the vertical part SP may increase with increasing distance from the sidewall of the vertical semiconductor pattern VS.

Referring to FIGS. 2, 3, and 6A, a dummy data storage pattern DSPr may be disposed between each of the vertical semiconductor patterns VS and the substrate 10 (or the well region 10w). The dummy data storage pattern DSPr may be provided in the substrate 10 or the well region 10w, and may separate the vertical semiconductor pattern VS from the substrate 10 or the well region 10w. The dummy data storage pattern DSPr may be interposed between a bottom surface of the vertical semiconductor pattern VS and the substrate 10 (or the well region 10w), and may extend onto the sidewall of the vertical semiconductor pattern VS. When viewed in cross-section, the dummy data storage pattern DSPr may have a U shape. The data storage pattern DSP may be spaced apart in the first direction D1 from the dummy data storage pattern DSPr.

The dummy data storage pattern DSPr may have an uppermost top surface at a height less than that of the top surface 10U of the substrate 10. The dummy data storage pattern DSPr may be vertically spaced apart from the data storage pattern DSP across the vertical part SP of the first source conductive pattern SCP1. The uppermost top surface of the dummy data storage pattern DSPr may contact the vertical part SP of the first source conductive pattern SCP1. The dummy data storage pattern DSPr may have substantially the same thin-film structure as that of the data storage pattern DSP. For example, the dummy data storage pattern DSPr may include a first dummy insulating pattern 210r between the vertical semiconductor pattern VS and the substrate 10 (or the well region 10w), a second dummy insulating pattern 200r between the first dummy insulating pattern 210r and the substrate 10 (or the well region 10w), and a third dummy insulating pattern 220r between the first dummy insulating pattern 210r and the vertical semiconductor pattern VS. The first, second, and third dummy insulating patterns 210r, 200r, and 220r may respectively include the same materials as those of the first, second, and third insulating patterns 210, 200, and 220.

Referring back to FIGS. 2 and 3, a buried insulating pattern 160 may fill an inside of each of the vertical semiconductor patterns VS. The buried insulating pattern 160 may include, for example, silicon oxide. A conductive pad 150 may be provided on each of the vertical semiconductor patterns VS. The conductive pad 150 may cover a top surface of the buried insulating pattern 160 and an uppermost top surface of the vertical semiconductor pattern VS. The conductive pad 150 may include an impurity-doped semiconductor material and/or a conductive material.

Common source plugs CSP may be provided on opposite sides of the electrode structure ST and coupled to the substrate 10 or the well region 10w. The common source plugs CSP may extend in the second direction D2 and may be spaced apart from each other in the third direction D3 across the electrode structure ST. The common source plugs CSP may be disposed on opposite sides of the source structure SC and spaced apart from each other in the third direction D3 across the source structure SC. Lateral insulating spacers SS may be provided on opposite sides of the electrode structure ST. Each of the lateral insulating spacers SS may be interposed between the electrode structure ST and the common source plug CSP. Each of the lateral insulating spacers SS may extend between the source structure SC and the common source plug CSP. For example, the common source plugs CSP may include a conductive material, and the lateral insulating spacers SS may include silicon nitride.

A capping insulating layer 120 may be provided on the electrode structure ST, covering a top surface of the electrode structure ST and a top surface of the conductive pad 150. An interlayer dielectric layer 130 may be provided on the capping insulating layer 120 and may cover top surfaces of the common source plugs CSP. The capping insulating layer 120 and the interlayer dielectric layer 130 may include an insulating material (e.g., silicon oxide). A first contact 125 may be provided on the conductive pad 150. The first contact 125 may penetrate the capping insulating layer 120 and has connection with the conductive pad 150. A second contact 135 may penetrate the interlayer dielectric layer 130 and has connection with the first contact 125. The first and second contacts 125 and 135 may include a conductive material, such as tungsten. Bit lines BL may be provided on the interlayer dielectric layer 130. The bit lines BL may extend in the third direction D3 and may be spaced apart from each other in the second direction D2. The vertical semiconductor patterns VS may include a dummy vertical semiconductor pattern DVS that is not connected to the first contact 125 or the second contact 135. Each of the vertical semiconductor patterns VS, except for the dummy vertical semiconductor pattern DVS, may be electrically connected to a corresponding one of the bit lines BL through the first and second contacts 125 and 135. The bit lines BL may include a conductive material. The source structure SC may be supplied with an erase voltage when the memory cell array of FIG. 1 operates in an erase mode, and in this case, a gate induced leakage current may occur at the erase control transistor ECT of FIG. 1. Accordingly, an erase operation may be performed on the memory cells of FIG. 1.

FIGS. 7 to 14, 15A to 17A, 18, and 19 illustrate cross-sectional views taken along line I-I' of FIG. 2, showing a method of fabricating a three-dimensional semiconductor memory device according to exemplary embodiments of inventive concepts. FIGS. 15B, 16B, and 17B illustrate enlarged views showing section B of FIGS. 15A, 16A, and 17A, respectively.

Referring to FIGS. 2 and 7, an insulating layer 11a may be formed on a substrate 10. The substrate 10 may be a semiconductor substrate (e.g., a silicon substrate, a germanium substrate, or a silicon-germanium substrate), and the insulating layer 11a may include, for example, a silicon oxide layer.

Referring to FIGS. 2 and 8, a lower sacrificial pattern LSP and a mask pattern MP may be sequentially formed on the insulating layer 11a. The formation of the lower sacrificial pattern LSP may include fanning a lower sacrificial layer on the insulating layer 11a, forming the mask pattern MP on the lower sacrificial layer, and exposing the insulating layer by performing an etching process using the mask pattern MP as an etching mask to etch the lower sacrificial layer. The etching process may cause the lower sacrificial pattern LSP to have an opening 250 exposing the insulating layer 11a. The opening 250 may have a linear shape extending in a second direction D2.

The lower sacrificial pattern LSP may include a material having an etch selectivity with respect to the insulating layer 11a. For example, the lower sacrificial pattern LSP may include one or more of a silicon nitride layer, a silicon oxynitride layer, a silicon carbide layer, and a silicon-germanium layer.

Referring to FIGS. 2 and 9, the mask pattern MP may be removed. A buffer insulating layer 12 and a source conductive layer SCP may be sequentially formed on the lower sacrificial pattern LSP. The buffer insulating layer 12 may be formed to have a uniform thickness covering a top surface of the lower sacrificial pattern LSP and lateral surfaces of the lower sacrificial pattern LSP that are exposed to the opening 250. The source conductive layer SCP may be formed to have a uniform thickness covering the top surface of the lower sacrificial pattern LSP and an inner surface of the opening 250. Since the source conductive layer SCP is formed to have a uniform thickness covering the inner surface of the opening 250, the source conductive layer SCP may have a top surface including a recessed surface 255 toward the opening 250. The buffer insulating layer 12 may include, for example, a silicon oxide layer. The source conductive layer SCP may include a polysilicon layer doped with, for example, N-type impurities.

Referring to FIGS. 2 and 10, a separation layer 13 may be formed to cover the recessed surface 255 of the source conductive layer SCP. The formation of the separation layer 13 may include forming an insulating layer on the source conductive layer SCP and performing a planarization process to expose the top surface of the source conductive layer SCP. The separation layer 13 may include, for example, silicon oxide.

Figure 11:
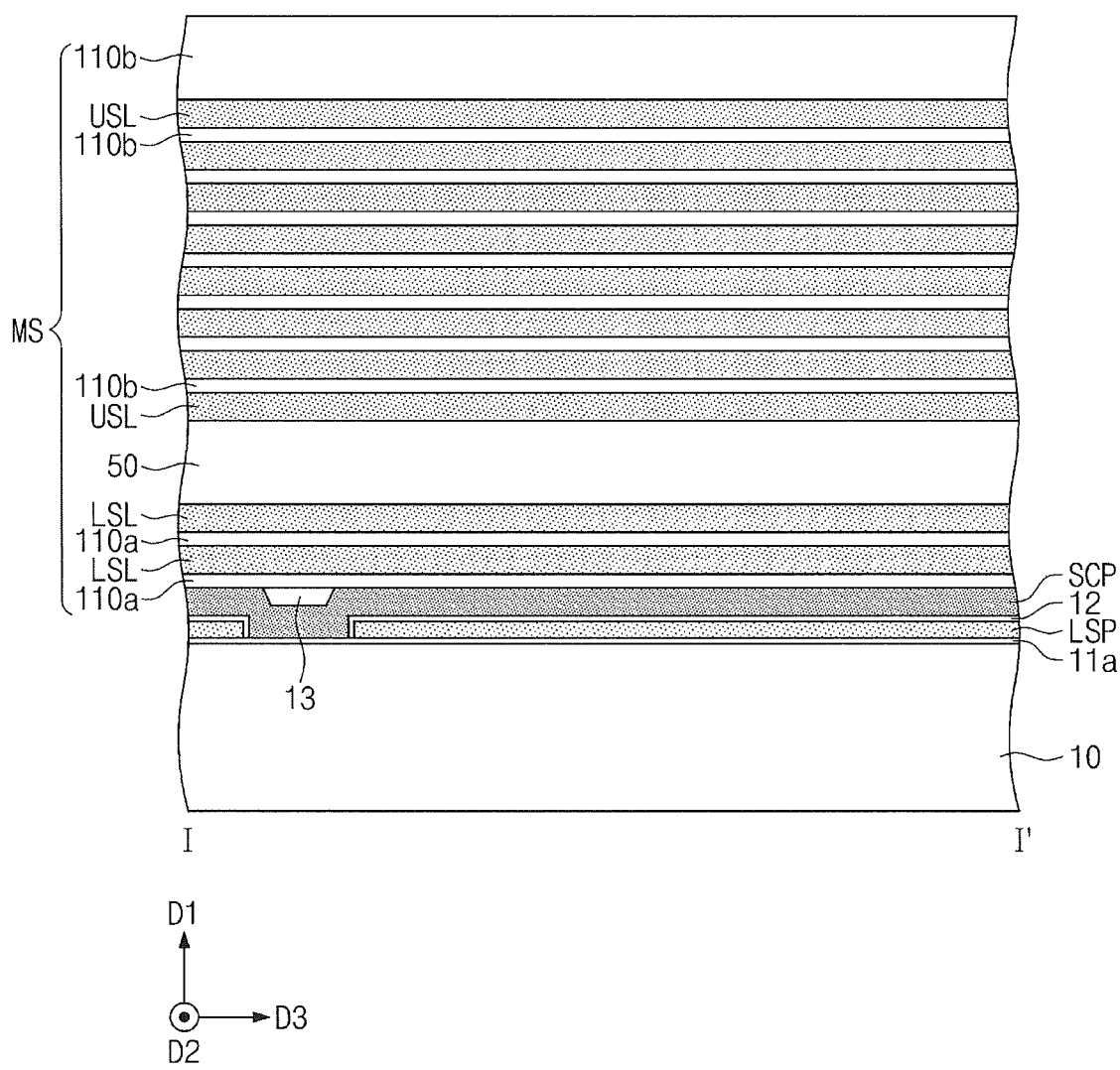

Referring to FIGS. 2 and 11, lower insulating layers 110a and lower sacrificial layers LSL may be alternately stacked on the source conductive layer SCP. The lower sacrificial layers LSL may include a material having an etch selectivity with respect to the lower insulating layers 110a. In some embodiments, the lower sacrificial layers LSL may include the same material as that of the lower sacrificial pattern LSP. A planarized insulating layer 50 may be formed on an uppermost one of the lower sacrificial layers LSL. The planarized insulating layer 50 may include, for example, a silicon oxide layer. Upper insulating layers 110b and upper sacrificial layers USL may be alternately stacked on the planarized insulating layer 50. The upper sacrificial layers USL may include a material having an etch selectivity with respect to the upper insulating layers 110b. In some embodiments, the upper sacrificial layers USL may include the same material as that of the lower sacrificial layers LSL and the lower sacrificial pattern LSP. For example, the upper and lower sacrificial layers USL and LSL may include a silicon nitride layer, and the upper and lower insulating layers 110b and 110a may include a silicon oxide layer. A mold structure MS may herein be defined to include the upper and lower sacrificial layers USL and LSL, the upper and lower insulating layers 110b and 110a, and the planarized insulating layer 50.

Figure 12:
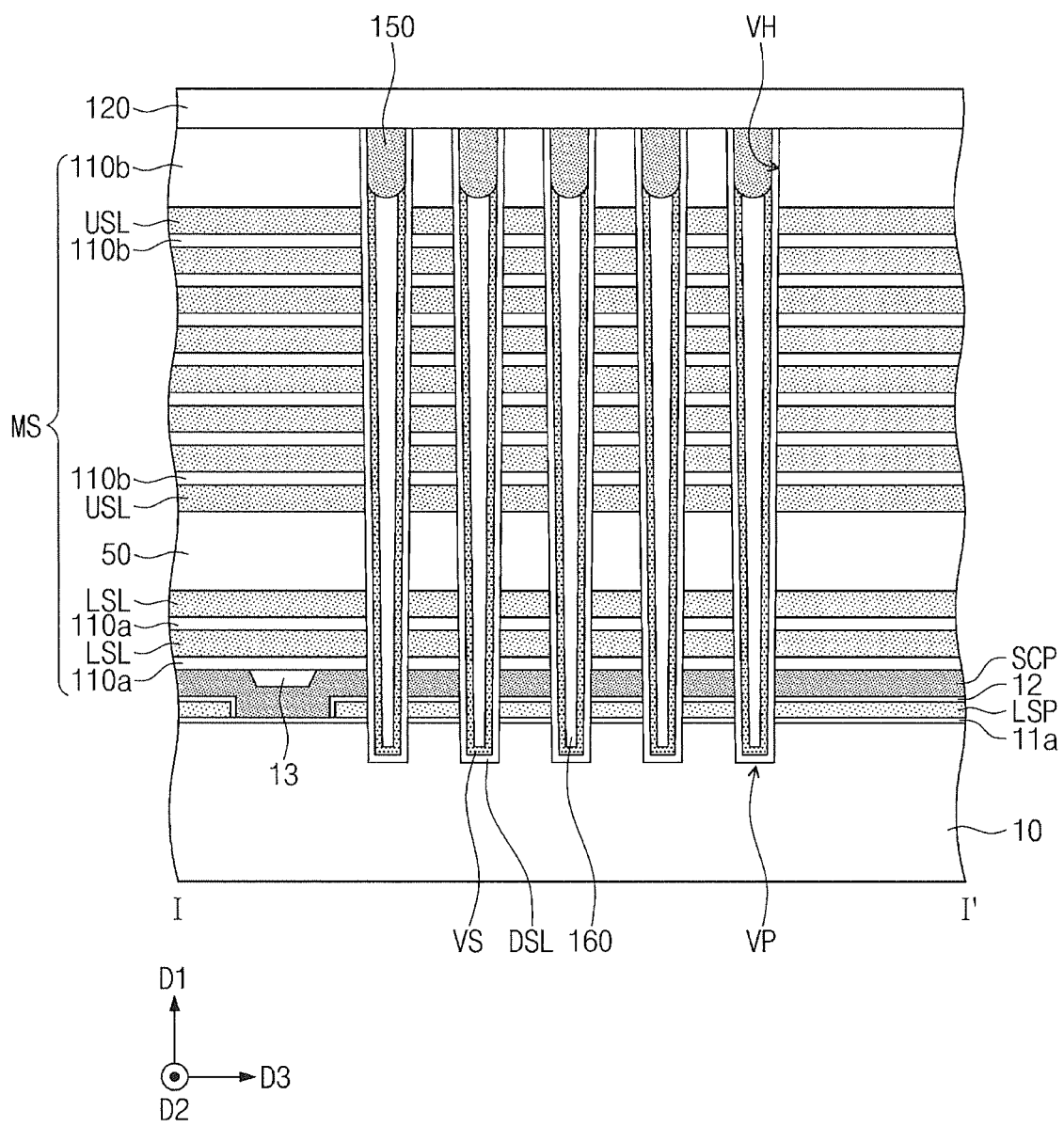

Referring to FIGS. 2 and 12, a separation insulating pattern 105 may be formed in the mold structure MS. The separation insulating pattern 105 may separate an uppermost one of the upper sacrificial layers USL. For example, the separation insulating pattern 105 may separate the uppermost one of the upper sacrificial layers USL into a pair of upper sacrificial layers USL horizontally spaced apart from each other.

A vertical structure VP may be formed to penetrate the mold structure MS, the source conductive layer SCP, the buffer insulating layer 12, the lower sacrificial pattern LSP, and the insulating layer 11 a. The formation of the vertical structure VP may include forming a vertical hole VH exposing the substrate 10 and penetrating the mold structure MS, the source conductive layer SCP, the buffer insulating layer 12, the lower sacrificial pattern LSP, and the insulating layer 11a, and then sequentially forming a data storage layer DSL and a vertical semiconductor pattern VS in the vertical hole VH. Each of the data storage layer DSL and the vertical semiconductor pattern VS may be formed to partially fill the vertical hole VH and to have a uniform thickness covering an inner surface of the vertical hole VH. The formation of the vertical structure VP may further include forming a buried insulating pattern 160 to fill a remaining portion of the vertical hole VH after the formation of the data storage layer DSL and the vertical semiconductor pattern VS.

The data storage layer DSL may include a blocking insulating layer, a charge storage layer, and a tunnel insulating layer that are sequentially stacked on the inner surface of the vertical hole VH. A chemical vapor deposition (CVD) or atomic layer deposition (ALD) process may be performed to deposit a uniformly thick semiconductor layer on the data storage layer DSL, and then a planarization process may be performed on the semiconductor layer to form the vertical semiconductor pattern VS. The vertical semiconductor pattern VS may be an impurity-doped semiconductor or an impurity-undoped intrinsic semiconductor. The formation of the vertical structure VP may further include forming a conductive pad 150 on a top end of the vertical semiconductor pattern VS. After the conductive pad 150 is formed, the mold structure MS may be provided thereon with a capping insulating layer 120 covering a top surface of the conductive pad 150.

Figure 13:
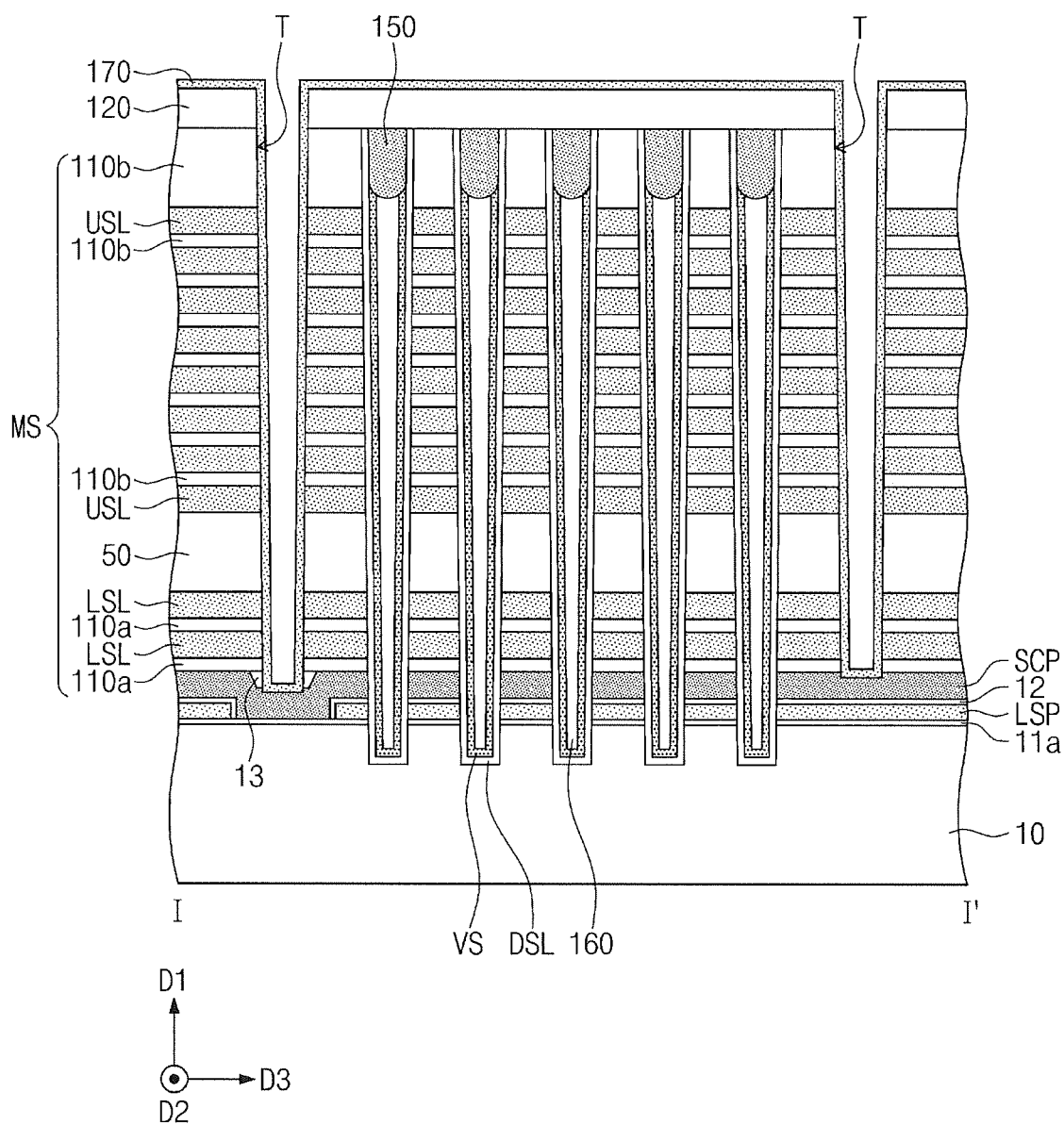

Referring to FIGS. 2 and 13, trenches T may be formed to penetrate the capping insulating layer 120 and the mold structure MS, and thus the source conductive layer SCP may be exposed to the trenches T. The trenches T may extend in the second direction D2 and may be spaced apart from each other in a third direction D3. The trenches T may be horizontally spaced apart from the vertical structures VP. A sacrificial spacer layer 170 may be formed on an inner surface of each of the trenches T. The sacrificial spacer layer 170 may be formed to partially fill each of the trenches T and to have a uniform thickness covering the inner surface of each of the trenches T. The sacrificial spacer layer 170 may include a material having an etch selectivity with respect to the mold structure MS. For example, the sacrificial spacer layer 170 may include a polysilicon layer.

Figure 14:
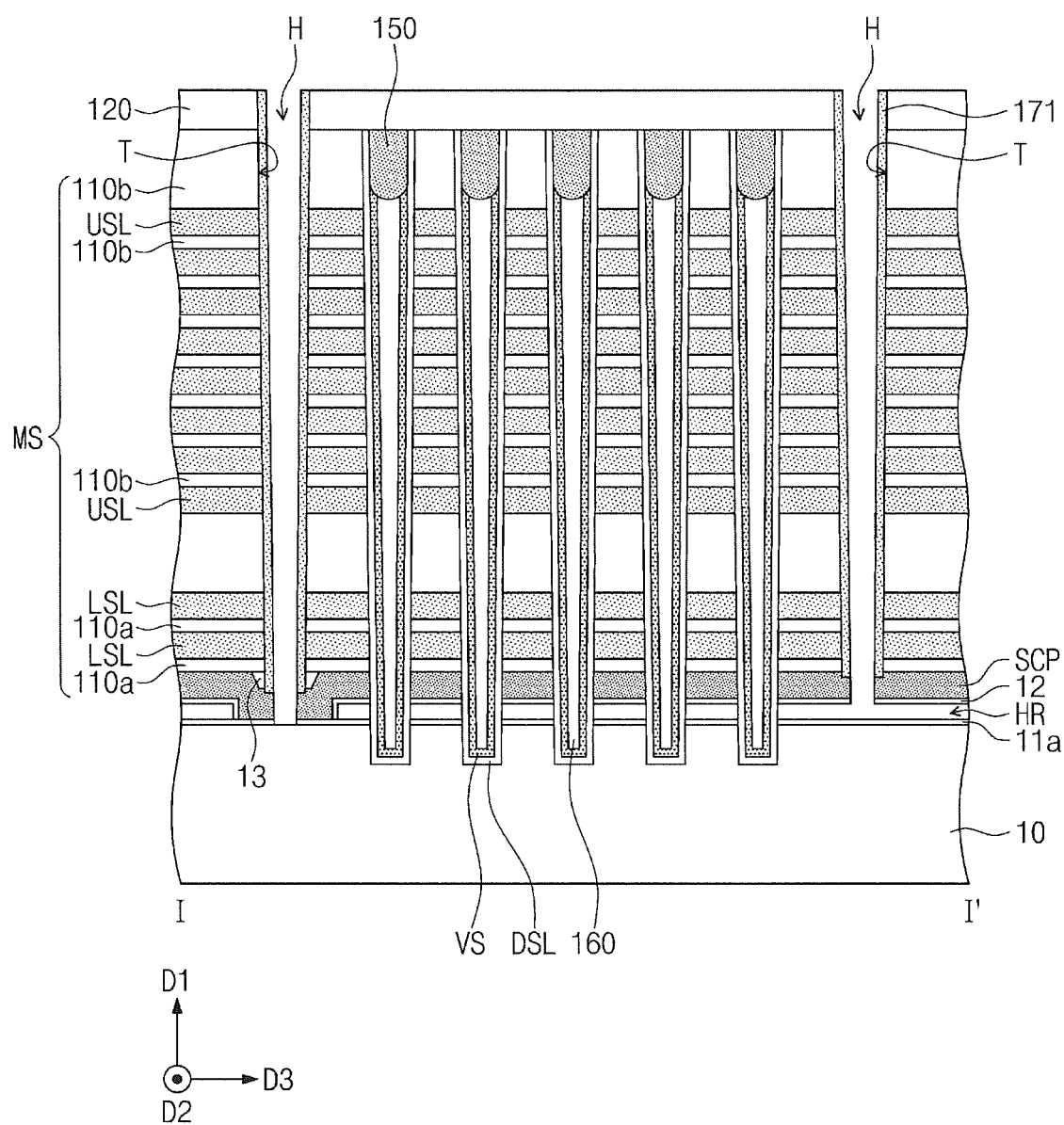

Referring to FIGS. 2 and 14, the sacrificial spacer layer 170 may be subjected to an anisotropic etching process to form a sacrificial spacer 171 on the inner surface of each of the trenches T. When the anisotropic etching process is performed on the sacrificial spacer layer 170, the anisotropic etching process may partially etch the source conductive layer SCP and the buffer insulating layer 12 that are exposed to each of the trenches T, with the result that each of the trenches T may have therein a through region H formed to expose the lower sacrificial pattern LSP shown in FIG. 13. An isotropic etching process may be performed to remove the lower sacrificial pattern LSP exposed to the through region H. The removal of the lower sacrificial pattern LSP may form a horizontal recess region HR that partially exposes the data storage layer DSL. The isotropic etching process may be performed under an etching condition having an etch selectivity with respect to the sacrificial spacer 171, the source conductive layer SCP, the buffer insulating layer 12, and the insulating layer 11a. The horizontal recess region HR may horizontally extend from the through region H toward a gap between the source conductive layer SCP and the substrate 10, and may correspond to an empty space between the source conductive layer SCP and the substrate 10. The source conductive layer SCP may have a portion filling the opening (see 250 of FIG. 8) of the lower sacrificial pattern LSP, and the portion may serve as a supporter that prevents collapse of the mold structure MS during the formation of the horizontal recess region HR.

Figure 15A:
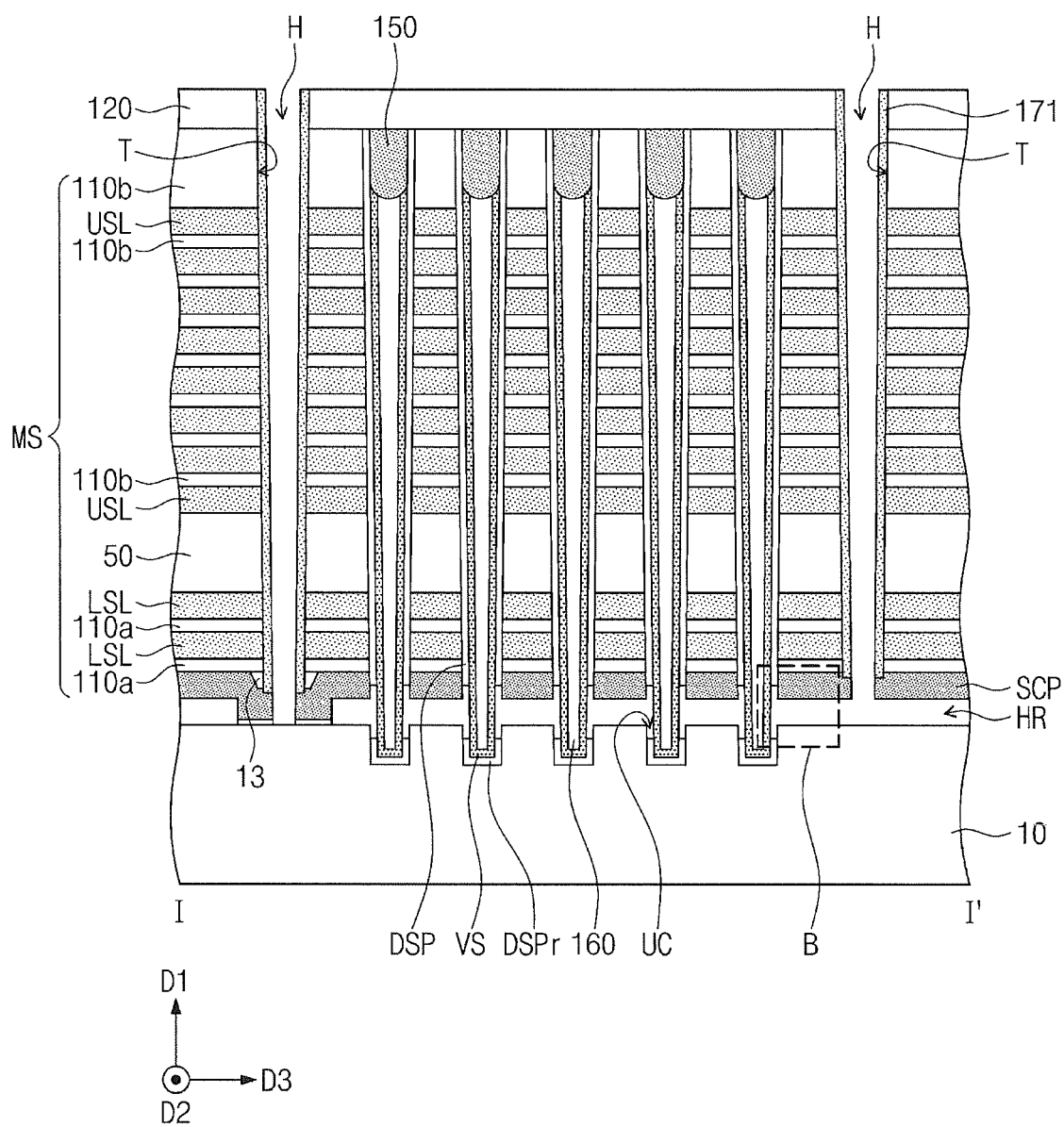
Figure 15B:
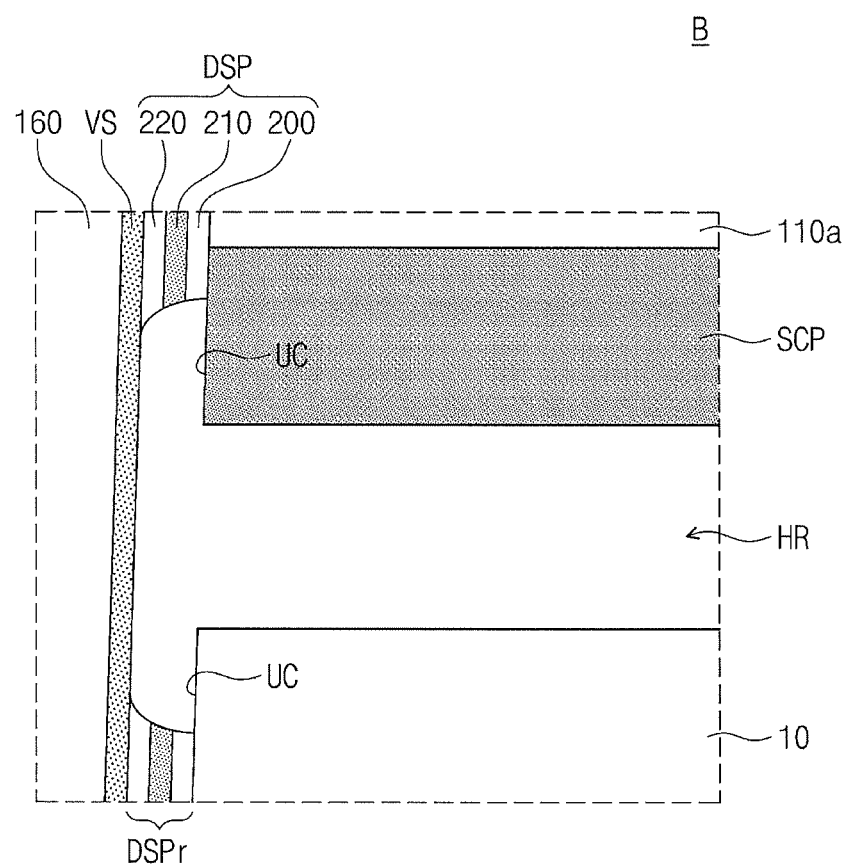
FIGS. 15B, 16B, and 17B illustrate enlarged views showing section B of FIGS. 15A, 16A, and 17A, respectively.

Referring to FIGS. 2, 15A, and 15B, a portion of the data storage layer DSL, which portion is exposed to the horizontal recess region HR, may be removed to partially expose a sidewall of the vertical semiconductor pattern VS. The removal of the portion of the data storage layer DSL may separate the data storage layer DSL into a data storage pattern DSP and a dummy data storage pattern DSPr that are vertically spaced apart from each other. The removal of the portion of the data storage layer DSL may include removing the buffer insulating layer 12 and a portion of the insulating layer 11a by performing an etching process having an etch selectivity with respect to the substrate 10, the source conductive layer SCP, the vertical semiconductor pattern VS, and the sacrificial spacer 171. Accordingly, the horizontal recess region HR may expose a bottom surface of the source conductive layer SCP and a top surface of the substrate 10. An undercut region UC may be formed due to the removal of the portion of the data storage layer DSL. The undercut region UC may be an empty space that extends in a vertical direction (e.g., a first direction D1) along the sidewall of the vertical semiconductor pattern VS from the horizontal recess region HR. The undercut region UC may extend between the sidewall of the vertical semiconductor pattern VS and a lateral surface of the source conductive layer SCP and between the sidewall of the vertical semiconductor pattern VS and the substrate 10. The undercut region UC may expose a bottom surface of the data storage pattern DSP and a top surface of the dummy data storage pattern DSPr.

Figure 16A:
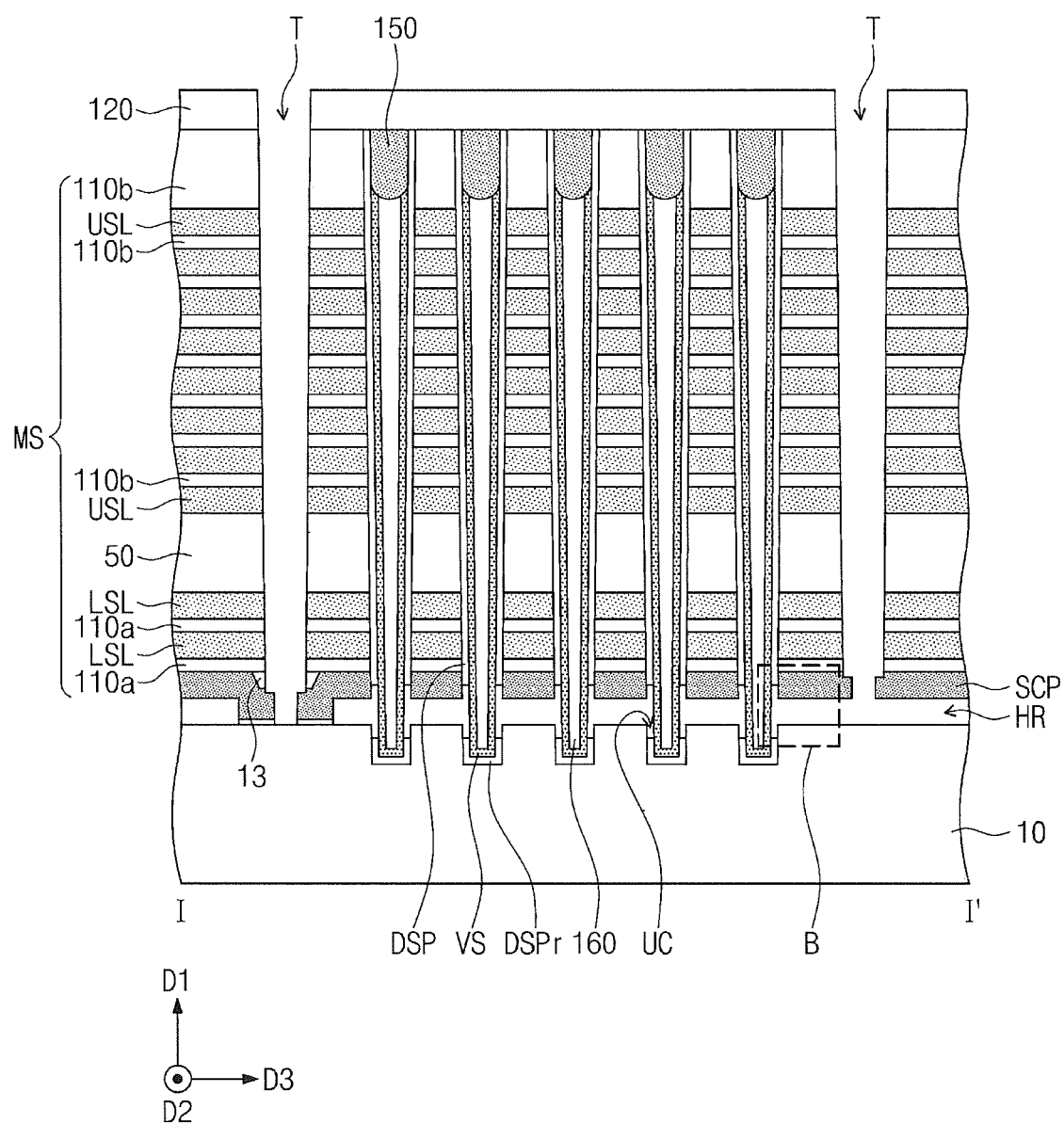
Figure 16B:
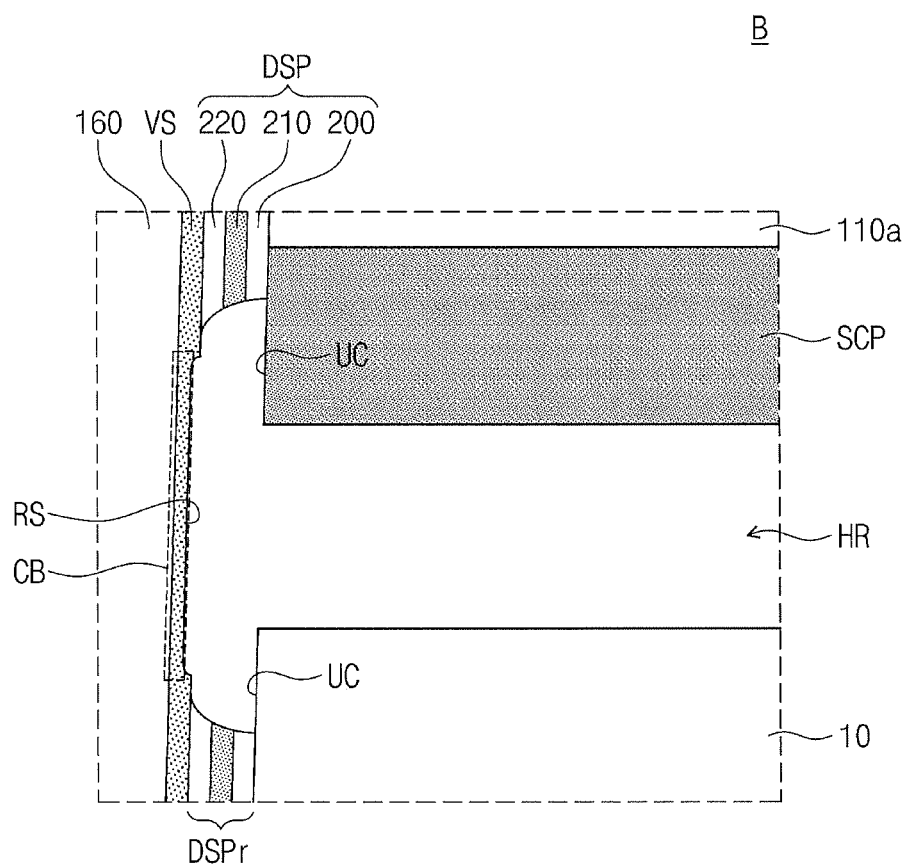

Referring to FIGS. 2, 16A, and 16B, the sacrificial spacer 171 may be removed to expose a sidewall of the mold structure MS. The removal of the sacrificial spacer 171 may be performed by an etching process having an etch selectivity with respect to the vertical semiconductor pattern VS. One of the sacrificial spacer 171 and the vertical semiconductor pattern VS may include a material having an etch selectivity with respect to the other. For example, the sacrificial spacer 171 may be formed of a material that can be etched while the vertical semiconductor pattern VS is minimally etched when a predetermined etch recipe is used to remove the sacrificial spacer 171.

This etch selectivity may be quantitatively expressed as a ratio of an etch rate of the sacrificial spacer 171 to an etch rate of the vertical semiconductor pattern VS. In some embodiments, the sacrificial spacer 171 may include one of materials having an etch selectivity of about 1:10 to about 1:200, more particularly, about 1:30 to about 1:100, with respect to the vertical semiconductor pattern VS.

The sacrificial spacer 171 may have a different crystallinity from that of the vertical semiconductor pattern VS. For example, the sacrificial spacer 171 may have a substantially amorphous state such as amorphous silicon, and the vertical semiconductor pattern VS may have a crystalline state such as polysilicon. Each of the source conductive layer SCP and the substrate 10 may have a similar crystallinity to that of the vertical semiconductor pattern VS. A difference in crystallinity between the sacrificial spacer 171 and the vertical semiconductor pattern VS may be employed to selectively remove the sacrificial spacer 171.

A dry etching process may be performed to selectively remove the sacrificial spacer 171. For example, HBr, $Cl_2$, or HCl may be used as a source to perform an etching process on the sacrificial spacer 171. The sacrificial spacer 171 may be etched by, for example, a plasma etching process.

The removal of the sacrificial spacer 171 may increase a diameter of the through region H. During the removal of the sacrificial spacer 171, a recess region RS may be formed on an exposed portion of the vertical semiconductor pattern VS. When the sacrificial spacer 171 is etched, the vertical semiconductor pattern VS may have an impurity region CB, including etchant atoms, on its portion adjacent to the recess region RS. For example, the impurity region CB may include bromine (Br) atoms and/or chlorine (Cl) atoms at a concentration of about $1\times10^{16}$ atoms/$cm^3$ to about $1\times10^{19}$ atoms/$cm^3$.

After the sacrificial spacer 171 is etched and removed, a surface treatment process may be performed to form a sidewall conductive layer which will be discussed below. For example, the surface treatment process may be performed using amine-containing silane as a source. In some embodiments, the surface treatment process may be performed by a deposition process that uses a source including at least one selected from a group consisting of bis(ethlymethylamino)silane (BEMAS), bis(diethylamino)silane (BDEAS), bis(dimethylamino)silane (BDMAS), tris(dimethylamino)silane (Tris-DMAS), tetrakis(dimethylamino)silane (TDMAS), tris(ethlymethylamino)silane (Tris-EMAS), diethylaminosiliane (DEAS), bis(tertybutylamino)silane (BTBAS), and diIsopropylaminosilane (DIPAS).

The surface treatment process may be called a seeding process. The surface treatment process may improve a surface roughness of a sidewall conductive layer which is subsequently formed.

Figure 17A:
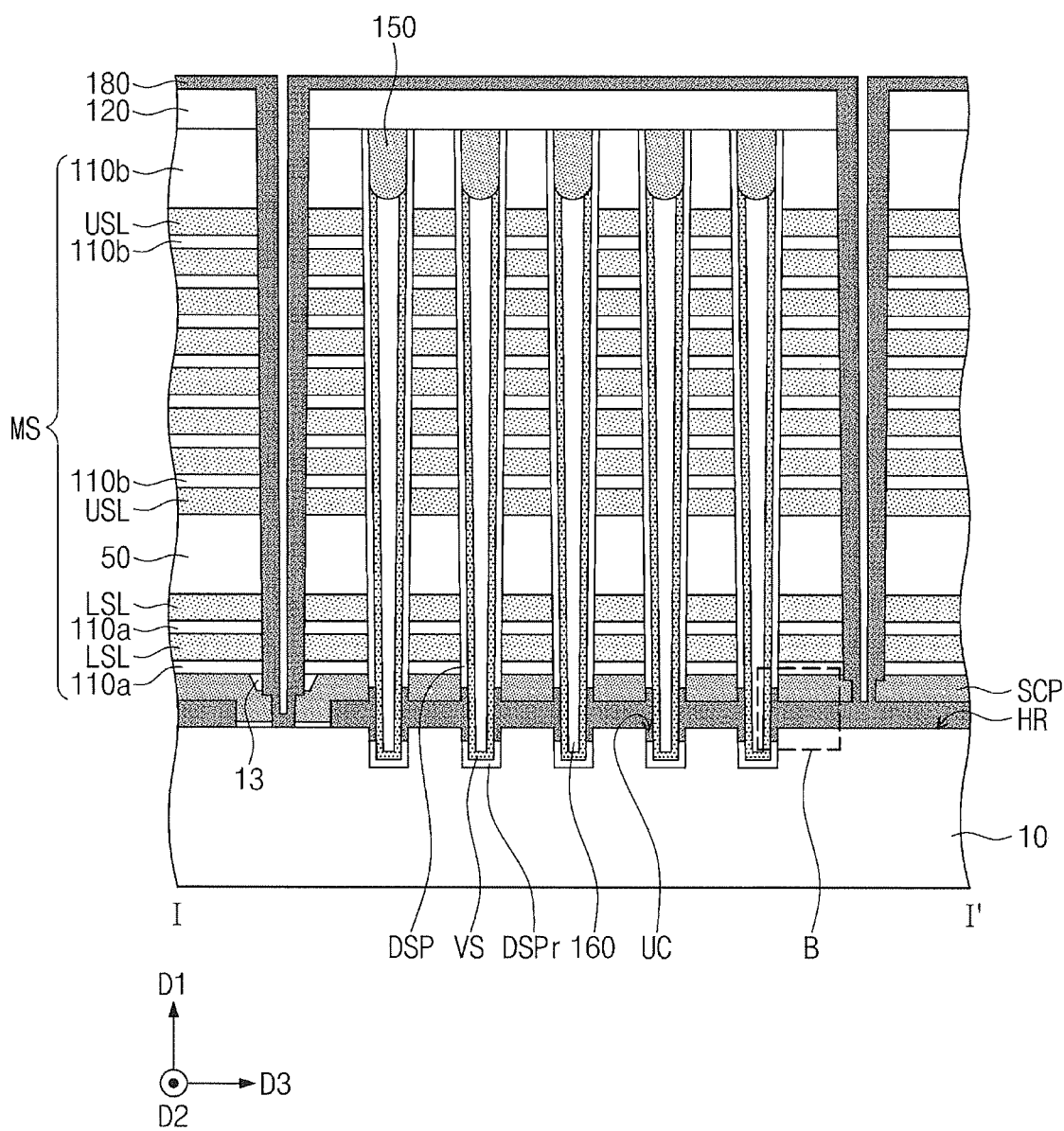
Figure 17B:
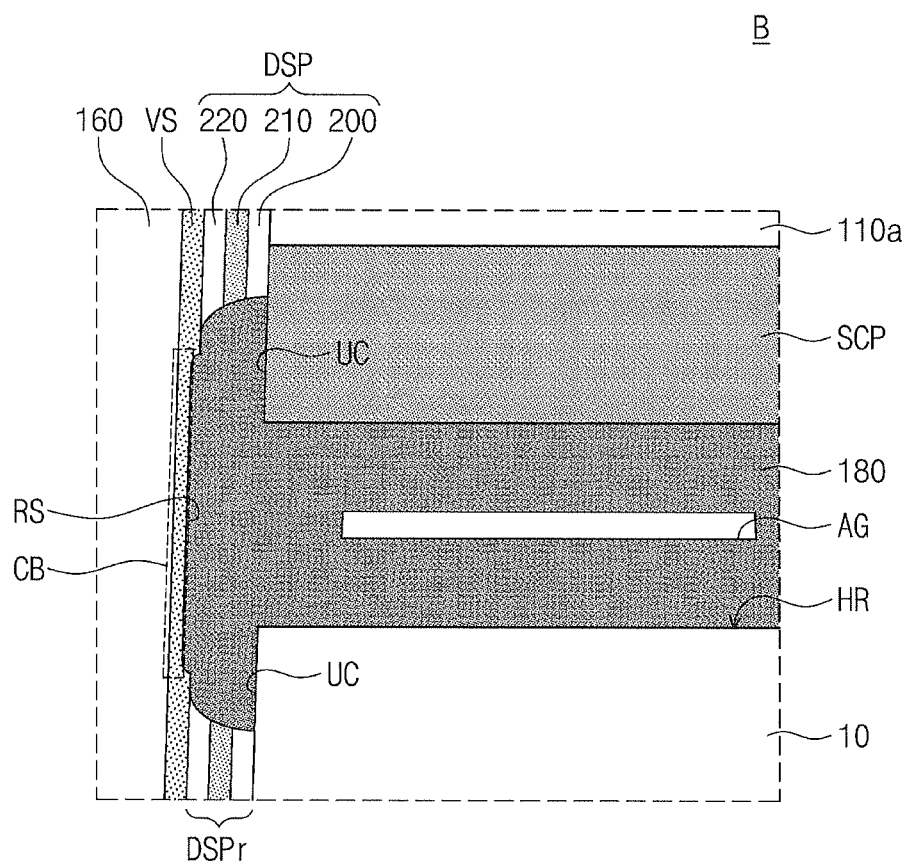

Referring to FIGS. 2, 17A, and 17B, a sidewall conductive layer 180 may be formed in the undercut region UC, the horizontal recess region HR, and the through region H. The sidewall conductive layer 180 may be formed using chemical vapor deposition (CVD) or atomic layer deposition (ALD). The sidewall conductive layer 180 may be an impurity-doped semiconductor layer, for example, a polysilicon layer doped with N-type impurities. For example, the sidewall conductive layer 180 may be formed using a silicon source, such as disilane ($Si_2H_6$), monosilane ($SiH_4$), trisilane ($Si_3H_8$), or chlorosilane (e.g., dichlorosilane, trichlorosilane, or tetrachlorosilane), which silicon source may be used alone or in a mixture thereof. Alternatively, N-type impurities may be used together with the silicon source. The surface treatment process and the formation of the sidewall conductive layer 180 may be performed in-situ in the same process chamber.

The sidewall conductive layer 180 having a uniform thickness may be deposited covering an inner surface of each of the undercut region UC, the horizontal recess region HR, and the through region H, but not to completely fill the through region H. During the deposition of the sidewall conductive layer 180, air gaps AG or seams may be formed in the sidewall conductive layer 180. The sidewall conductive layer 180 may directly contact the sidewall of the vertical semiconductor pattern VS and the top surface of the substrate 10. The sidewall conductive layer 180 may fill the recess regions RS.

Figure 18:
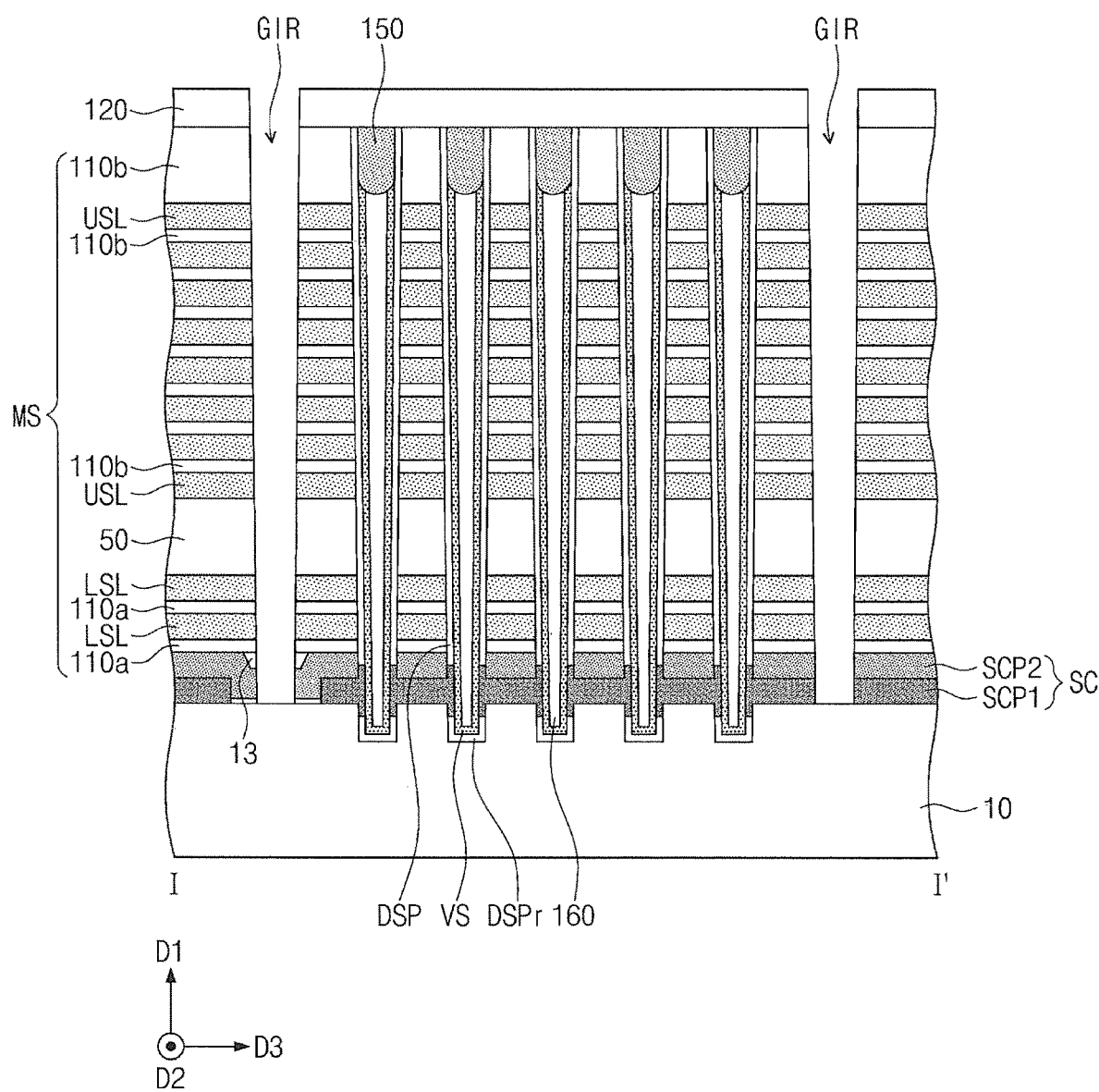

Referring to FIGS. 2 and 18, the sidewall conductive layer 180 may be subjected to an isotropic etching process to form a first source conductive pattern SCP1 in the undercut region UC and the horizontal recess region HR. Gate isolation regions GIR may be formed between a plurality of first source conductive patterns SCP1, and may expose the sidewall of the mold structure MS. The isotropic etching process on the sidewall conductive layer 180 may be performed using an etch recipe having an etch selectivity with respect to the mold structure MS. For example, the isotropic etching process on the sidewall conductive layer 180 may be a wet etching process that uses a deionized water mixture (SC1: standard clean 1) or ammonium hydroxide ($NH_4OH$).

The source conductive layer SCP may be etched during the isotropic etching process on the sidewall conductive layer 180. The source conductive layer SCP may be etched to form a second source conductive pattern SCP2. The first and second source conductive patterns SCP1 and SCP2 may be called a source structure SC. The gate isolation regions GIR may expose the sidewall of the mold structure MS, a lateral surface of the source structure SC, and the top surface of the substrate 10.

When the surface treatment process is performed without removing the sacrificial spacer 171, the sacrificial spacer 171 may contain impurity atoms on its surface originating from the source of the surface treatment process. For example, the impurity atoms may be or include carbon atoms and/or nitrogen atoms. Thereafter, when the sidewall conductive layer 180 is formed, carbon atoms and/or nitrogen atoms may remain between the sacrificial spacer 171 and the sidewall conductive layer 180. In this case, when the isotropic process is performed as discussed with reference to FIG. 18, the carbon atoms and/or nitrogen atoms may cause incomplete separation of the first source conductive patterns SCP1. If an etching amount is increased, i.e., over-etching, to completely separate the first source conductive patterns SCP1, the air gaps AG or seams may be exposed as a result of the over-etching required to completely separate the first source conductive patterns SCP1, and thus current leakage or electrical shorts may be generated in a subsequent process for forming electrodes, which may result in deterioration in electrical characteristics and/or reliability of semiconductor devices.

According to some embodiments of inventive concepts, since the sacrificial spacer 171 is removed prior to the surface treatment process, the isotropic etching process to form the first source conductive pattern SCP1 may be performed without over-etching. As a result, it is possible to prevent deterioration in electrical characteristics and/or reliability of semiconductor devices.

Figure 19:
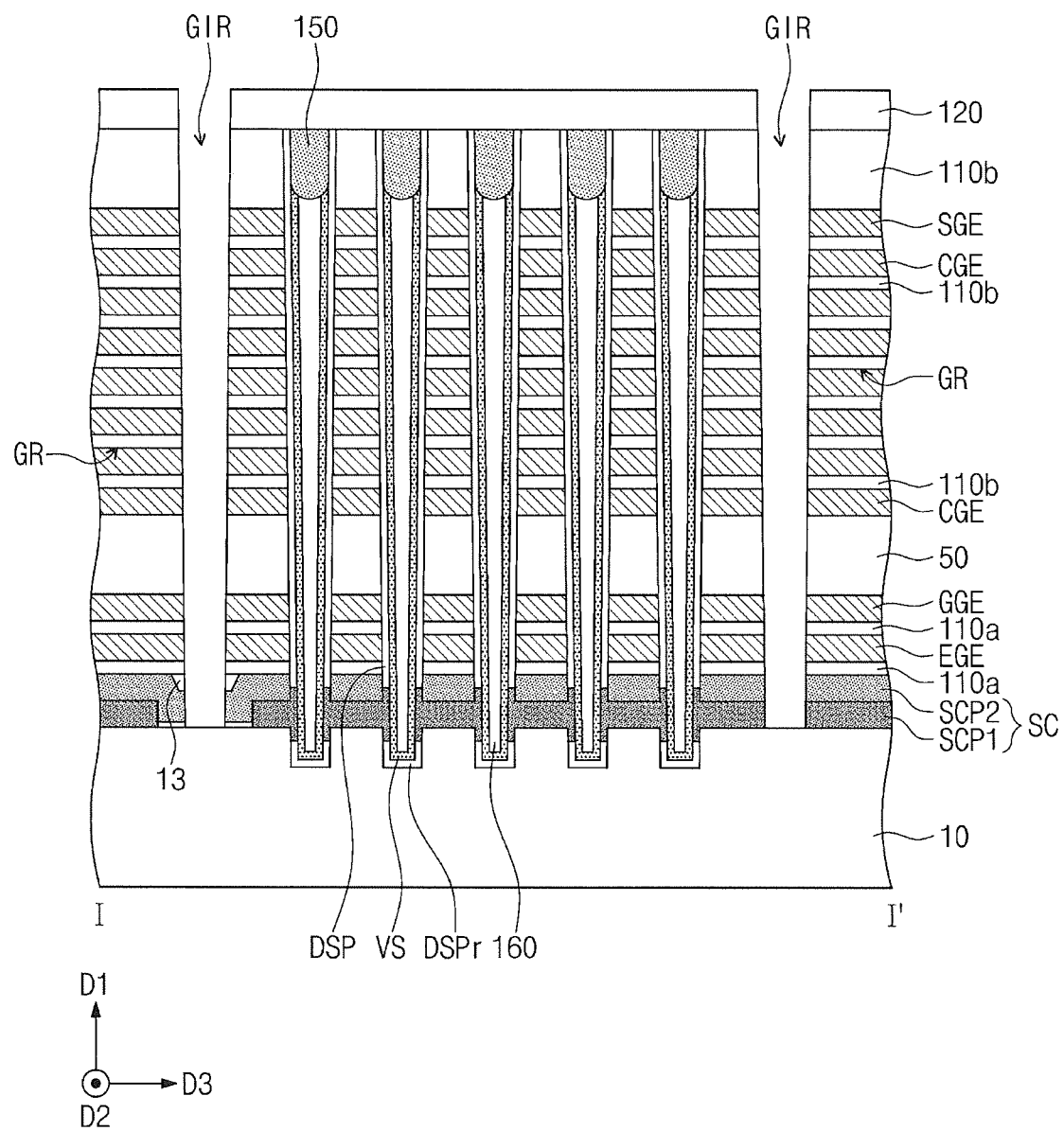

Referring to FIGS. 2 and 19, a removal process may be performed on the lower and upper sacrificial layers LSL and USL exposed to the gate isolation regions GIR. Thus, gate regions GR may be formed between the lower and upper insulating layers 110a and 110b. The formation of the gate regions GR may include isotropically etching the lower and upper sacrificial layers LSL and USL by performing an etching process having an etch selectivity with respect to the lower and upper insulating layers 110a and 110b, the data storage pattern DSP, the first and second source conductive patterns SCP1 and SCP2, and the substrate 10. Each of the gate regions GR may horizontally extend from a corresponding one of the gate isolation regions GIR and partially expose a lateral surface of the data storage pattern DSP. Afterward, gate electrodes EGE, GGE, CGE, and SGE may be formed to fill the gate regions GR. For example, the formation of the gate electrodes EGE, GGE, CGE, and SGE may include forming a gate electrode layer to fill the gate isolation regions GIR and the gate regions GR, and then partially removing the gate electrode layer from the gate isolation regions GIR to locally form the gate electrodes EGE, GGE, CGE, and SGE in the gate regions GR.

Referring back to FIGS. 2 and 3, common source plugs CSP may be correspondingly formed in the gate isolation regions GIR, and lateral insulating spacers SS may be correspondingly formed in the gate isolation regions GIR. The common source plugs CSP and the lateral insulating spacers SS may be locally formed in the gate isolation regions GIR. A first contact 125 may be formed in the capping insulating layer 120 and may have connection with the conductive pad 150. An interlayer dielectric layer 130 may be formed on the capping insulating layer 120 and may cover top surfaces of the common source plugs CSP. A second contact 135 may be formed in the interlayer dielectric layer 130 and may have connection with the first contact 125. Bit lines BL may be formed on the interlayer dielectric layer 130. The vertical semiconductor patterns VS may include a dummy vertical semiconductor pattern DVS that is not connected to the first contact 125 or the second contact 135. Each of the vertical semiconductor patterns VS, except for the dummy vertical semiconductor pattern DVS, may be electrically connected to a corresponding one of the bit lines BL through the first and second contacts 125 and 135.

According to inventive concepts, a three-dimensional semiconductor memory device may be provided to have enhanced electrical characteristics. Furthermore, the three-dimensional semiconductor memory device may have improved reliability.

The aforementioned description provides exemplary embodiments for explaining inventive concepts. Therefore, inventive concepts are not limited to the embodiments described above, and it will be understood by one of ordinary skill in the art that variations in form and detail may be made therein without departing from the spirit and essential features of inventive concepts.

What is claimed is:

1. A method of fabricating a three-dimensional semiconductor memory device comprising:
   sequentially forming a sacrificial pattern and a source conductive layer on a substrate;
   forming a mold structure comprising a plurality of insulating layers and a plurality of sacrificial layers on the source conductive layer;
   forming a plurality of vertical structures that penetrate the mold structure;
   forming a trench that penetrates the mold structure;
   forming a sacrificial spacer on a sidewall of the trench;
   removing the sacrificial pattern to form a horizontal recess region;
   removing the sacrificial spacer; and
   forming a source conductive pattern that fills the horizontal recess region,
   wherein forming the source conductive pattern further comprises forming a sidewall conductive layer in the trench and the horizontal recess region, and performing an isotropic etching process on the sidewall conductive layer.

2. The method of claim 1, wherein the sacrificial spacer comprises amorphous silicon.

3. The method of claim 1, wherein removing the sacrificial spacer comprises performing a dry etching process using HBr, $Cl_2$, or HCl.

4. The method of claim 1, wherein removing the sacrificial spacer comprises exposing sidewalls of the plurality of insulating layers and sidewalls of the plurality of sacrificial layers.

5. The method of claim 1, wherein each of the plurality of vertical structures comprises a vertical semiconductor pattern and a data storage layer surrounding the vertical semiconductor pattern,
   wherein the method further comprises removing a portion of the data storage layer exposed to the horizontal recess region to expose a sidewall of the vertical semiconductor pattern before removing the sacrificial spacer.

6. The method of claim 5, wherein removing the sacrificial spacer comprises forming a recess region on the sidewall of the vertical semiconductor pattern.

7. A method of fabricating a three-dimensional semiconductor memory device comprising:
   sequentially forming a sacrificial pattern and a source conductive layer on a substrate;
   forming a mold structure comprising a plurality of insulating layers and a plurality of sacrificial layers on the source conductive layer;
   forming a plurality of vertical structures that penetrate the mold structure;
   forming a trench that penetrates the mold structure;
   forming a sacrificial spacer on a sidewall of the trench;
   removing the sacrificial pattern to form a horizontal recess region;
   removing the sacrificial spacer; and
   forming a source conductive pattern that fills the horizontal recess region,
   wherein each of the vertical structures comprises a vertical semiconductor pattern and a data storage layer surrounding the vertical semiconductor pattern,
   wherein the method further comprises removing a portion of the data storage layer exposed to the horizontal recess region to expose a sidewall of the vertical semiconductor pattern before removing the sacrificial spacer, and
   wherein removing the portion of the data storage layer forms an undercut region where the horizontal recess region extends along the sidewall of the vertical semiconductor pattern, the undercut region extending between the sidewall of the vertical semiconductor pattern and a sidewall of the source conductive layer.

8. The method of claim 1, further comprising performing a surface treatment process, after removing the sacrificial spacer and before forming the sidewall conductive layer.

9. The method of claim 8, wherein the surface treatment process is performed using amine-containing silane as a source.

10. The method of claim 8, wherein the surface treatment process and forming the sidewall conductive layer are performed in-situ in the same process chamber.

11. A method of fabricating a three-dimensional semiconductor memory device comprising:
- sequentially forming a sacrificial pattern and a source conductive layer on a substrate;
- forming a mold structure comprising a plurality of insulating layers and a plurality of sacrificial layers on the source conductive layer;
- forming a plurality of vertical structures comprising a vertical semiconductor pattern and a data storage layer that penetrate the mold structure;
- forming a trench that penetrates the mold structure;
- forming a sacrificial spacer on a sidewall of the trench;
- removing the sacrificial pattern to form a horizontal recess region;
- removing a portion of the data storage layer exposed to the horizontal recess region to expose a sidewall of the vertical semiconductor pattern;
- selectively removing the sacrificial spacer;
- performing a surface treatment process after removing the sacrificial spacer; and
- forming a source conductive pattern that fills the horizontal recess region,
- wherein sequentially forming the sacrificial pattern and the source conductive layer on the substrate comprises forming an opening in the sacrificial pattern, and forming the source conductive layer to fill the opening.

12. The method of claim 11, wherein the surface treatment process is performed using amine-containing silane as a source.

* * * * *